United States Patent
Morita et al.

(10) Patent No.: US 11,410,595 B2
(45) Date of Patent: Aug. 9, 2022

(54) DISPLAY DEVICE AND DRIVING METHOD FOR DISPLAY DEVICE

(71) Applicant: Japan Display Inc., Tokyo (JP)

(72) Inventors: Tetsuo Morita, Tokyo (JP); Yasuhiro Ogawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/109,242

(22) Filed: Dec. 2, 2020

(65) Prior Publication Data

US 2021/0110763 A1    Apr. 15, 2021

Related U.S. Application Data

(63) Continuation of application No. PCT/JP2019/018152, filed on Apr. 26, 2019.

(30) Foreign Application Priority Data

Jun. 6, 2018  (JP) .............................. JP2018-108596

(51) Int. Cl.
  *G09G 3/32*     (2016.01)
  *H01L 25/075*   (2006.01)
  (Continued)

(52) U.S. Cl.
  CPC ............ *G09G 3/2081* (2013.01); *G09G 3/32* (2013.01); *G09G 3/3233* (2013.01); *H01L 25/0753* (2013.01); *G09G 2300/0809* (2013.01); *G09G 2310/0251* (2013.01); *G09G 2310/08* (2013.01); *G09G 2320/0233* (2013.01); *G09G 2320/0626* (2013.01); *G09G 2330/021* (2013.01)

(58) Field of Classification Search
  None
  See application file for complete search history.

(56) References Cited

U.S. PATENT DOCUMENTS

| 6,583,775 B1 * | 6/2003 | Sekiya ...................... G09G 3/30 345/82 |
| 2006/0022899 A1 * | 2/2006 | Johnson ............... G09G 3/3233 345/55 |

(Continued)

OTHER PUBLICATIONS

International Search Report dated Jul. 30, 2019 for the PCT application No. PCT/JP2019/018152, with English translation.

*Primary Examiner* — Patrick N Edouard
*Assistant Examiner* — Peijie Shen
(74) *Attorney, Agent, or Firm* — Michael Best & Friedlich LLP

(57) ABSTRACT

According to one embodiment, a display device includes a display area and a driver. Each of pixels includes a light emitting element and a drive transistor connected in series. An image signal includes a first luminance data and a second luminance data. The first luminance data is based on an average value of a gradation value of pixels, and is common among the pixels included in said one area. The second luminance data is, based on a difference between the gradation value and the average value, an independent luminance data of each of the pixels. The driver controls a common luminance time of the pixels based on the first luminance data, and controls a current value to be supplied to the luminance element of each of the pixels based on the second luminance data.

14 Claims, 16 Drawing Sheets

(51) Int. Cl.
*G09G 3/20* (2006.01)
*G09G 3/3233* (2016.01)

(56) References Cited

U.S. PATENT DOCUMENTS

| | | | | |
|---|---|---|---|---|
| 2008/0284767 | A1* | 11/2008 | Mori | G09G 3/3225 345/207 |
| 2009/0273558 | A1* | 11/2009 | Lee | G09G 3/3426 345/102 |
| 2010/0328359 | A1* | 12/2010 | Inoue | G09G 3/3233 345/690 |
| 2011/0292018 | A1* | 12/2011 | Kubota | G09G 3/3426 345/102 |
| 2013/0208030 | A1* | 8/2013 | Sarrasin | G09G 3/2081 345/691 |
| 2014/0160180 | A1* | 6/2014 | Oda | G09G 3/32 345/690 |
| 2014/0340437 | A1* | 11/2014 | Kohashikawa | G09G 3/3406 345/694 |
| 2016/0335957 | A1* | 11/2016 | Fu | G09G 3/2018 |
| 2017/0345379 | A1* | 11/2017 | Guo | G09G 3/342 |
| 2018/0019233 | A1 | 1/2018 | Chang et al. | |

* cited by examiner

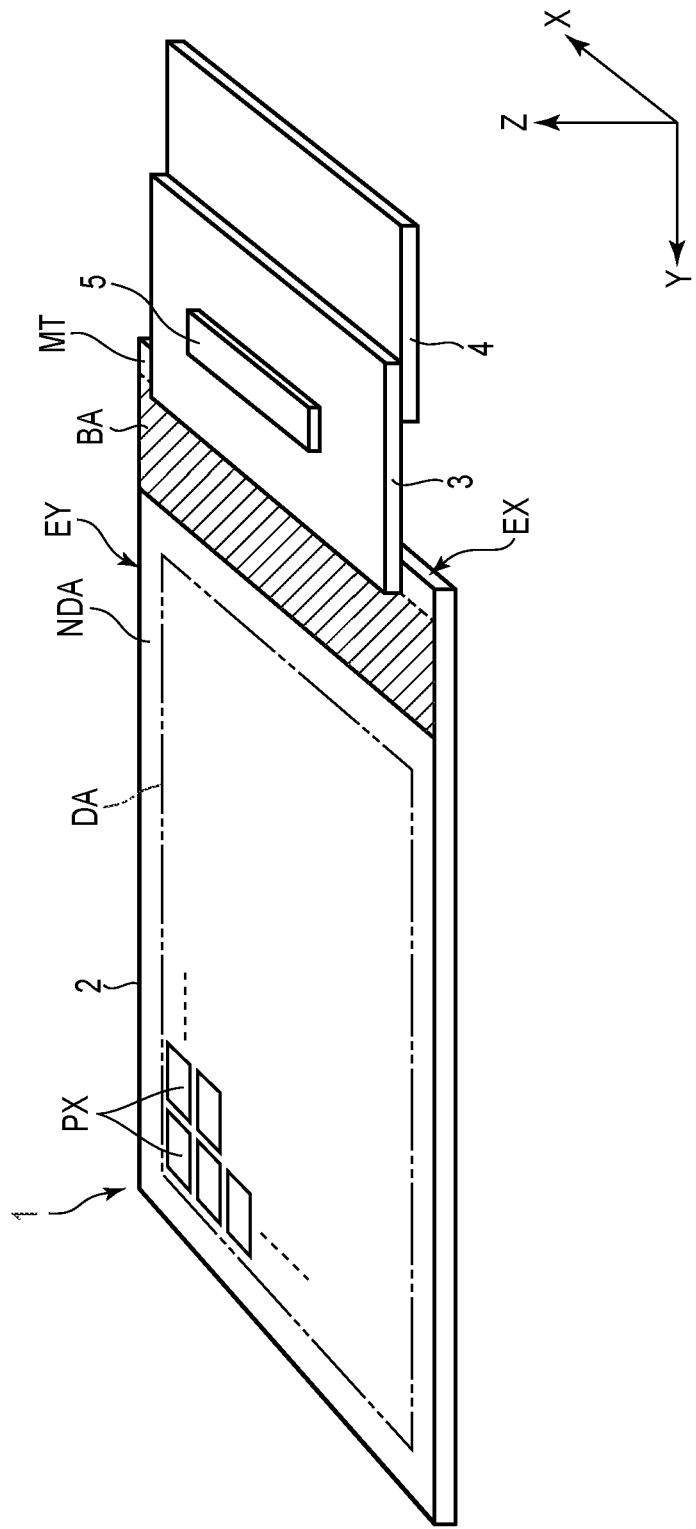
F I G. 1

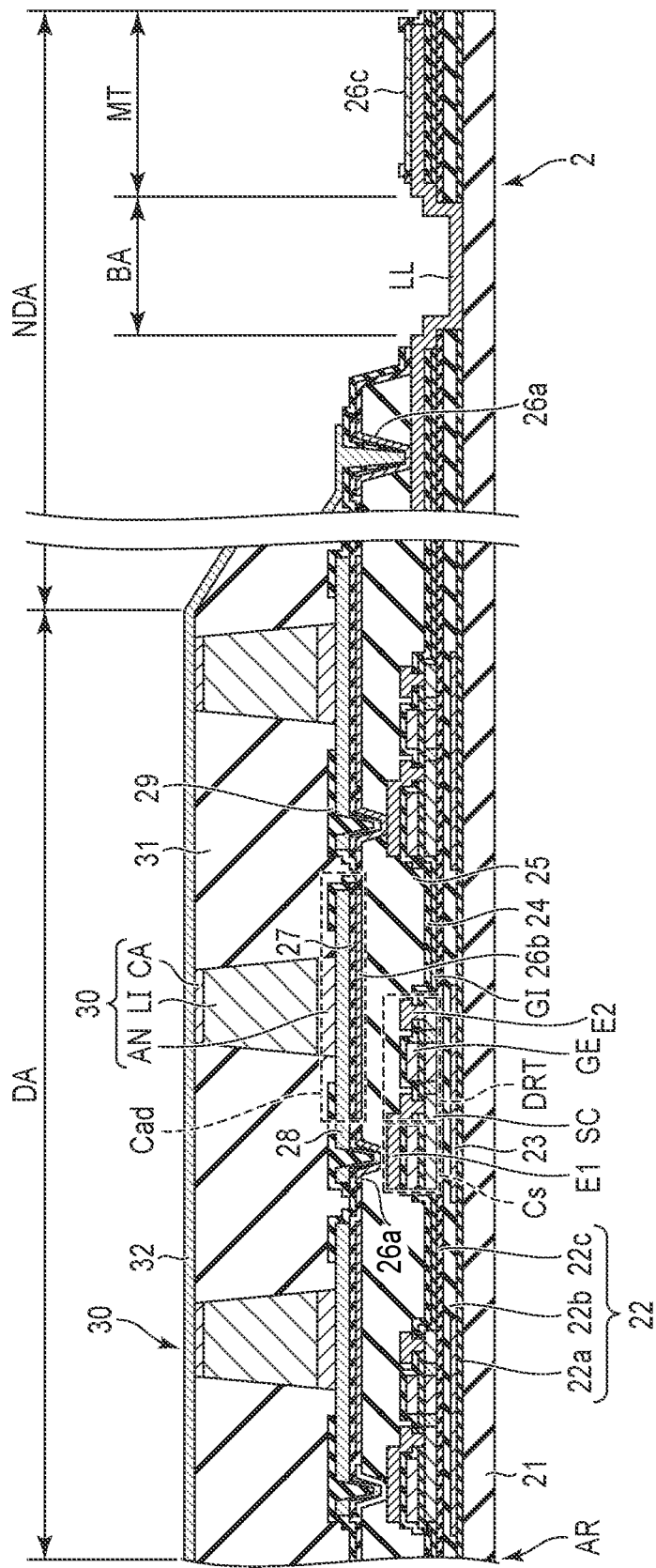
F I G. 2

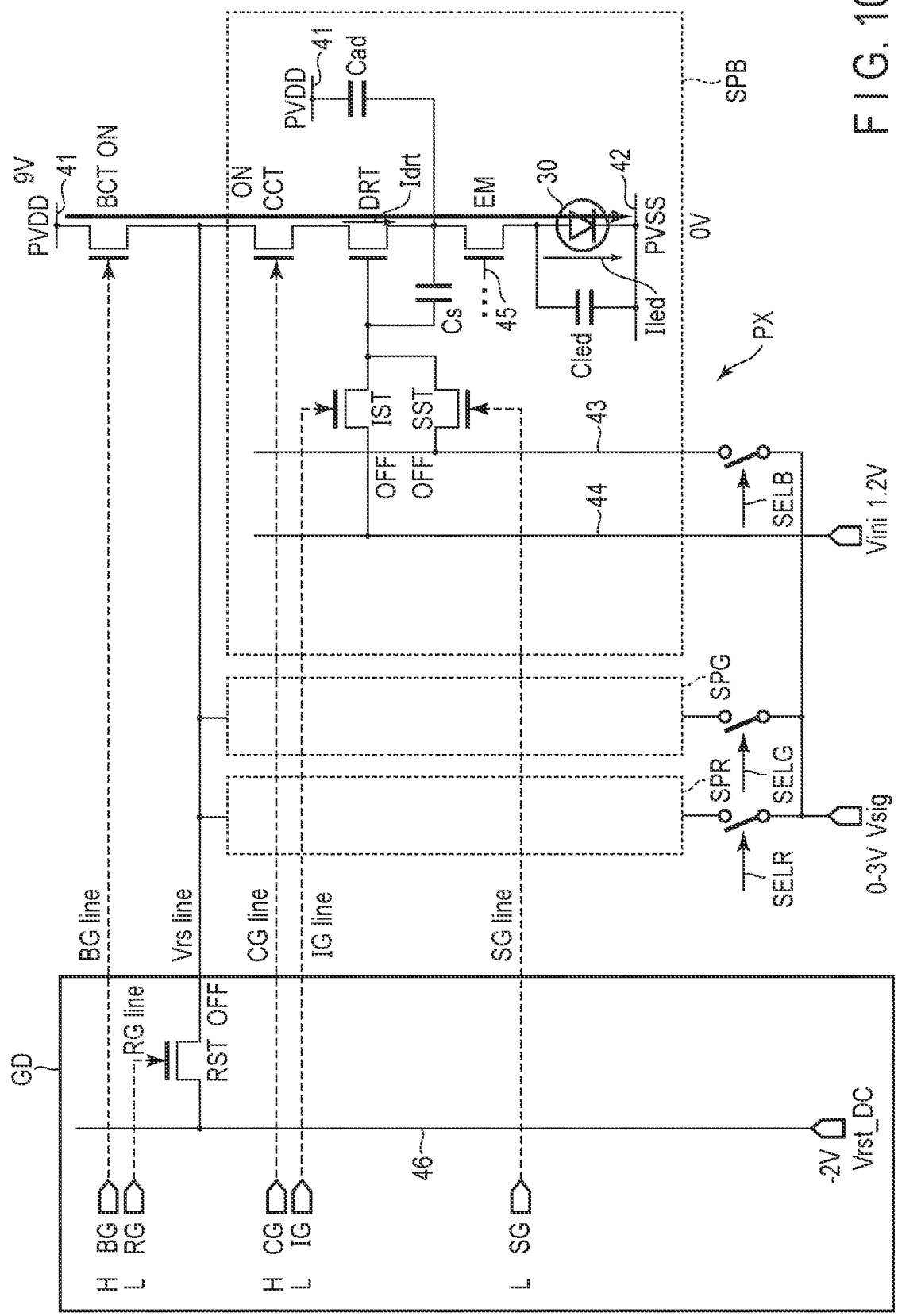
F I G. 10

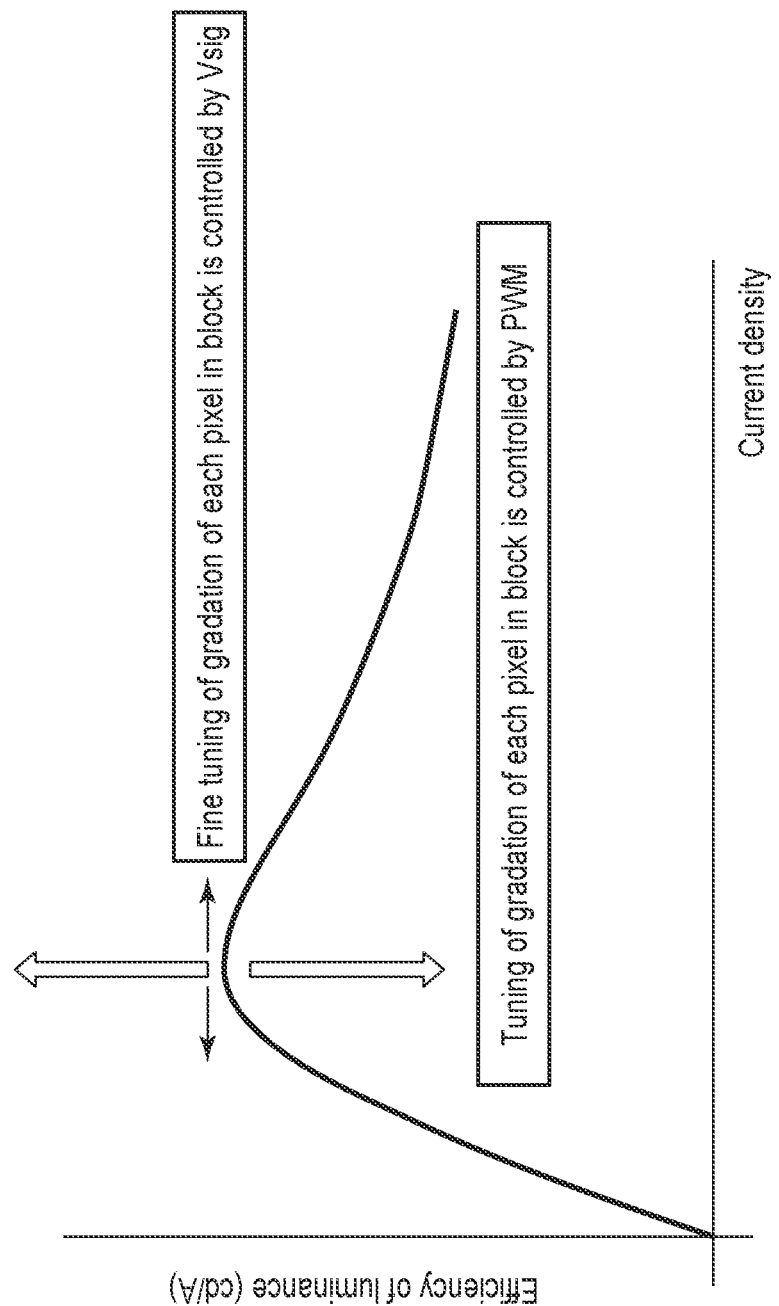
F I G. 16

DISPLAY DEVICE AND DRIVING METHOD FOR DISPLAY DEVICE

CROSS-REFERENCE TO RELATED APPLICATIONS

This application is a Continuation Application of PCT Application No. PCT/JP2019/018152, filed Apr. 26, 2019 and based upon and claiming the benefit of priority from Japanese Patent Application No. 2018-108596, filed Jun. 6, 2018, the entire contents of all of which are incorporated herein by reference.

FIELD

Embodiments described herein relate generally to a display device and a driving method of a display device.

BACKGROUND

LED displays using a light emitting diode (LED) which is a self-luminous element are known. In recent years, as a type of a higher definition display device, a display device using a micro light emitting diode element which is referred to as micro LED has been developed (hereinafter will be referred to as micro LED display).

The micro LED display is, unlike a conventional liquid crystal display and organic EL display, a display with many micro LEDs mounted on a display area, and thus, it can easily be made into both high definition and large display size. Thus, the micro LED display is expected to be the next generation display.

However, it is known that the efficiency of light emittance of elements differs in the micro LED display depending on the current density supplied to each element. Thus, it is difficult to achieve high luminosity with lower power.

BRIEF DESCRIPTION OF THE DRAWINGS

FIG. 1 is a schematic perspective view of the structure of a display device of an embodiment.

FIG. 2 illustrates a schematic view of an example of a cross-sectional structure of the display device.

FIG. 10 illustrates an outline of luminance operation of a light emitting element.

FIG. 16 illustrates a relationship between efficiency of luminance of the light emitting element and current density flowing to the light emitting element.

DETAILED DESCRIPTION

Figure 3:
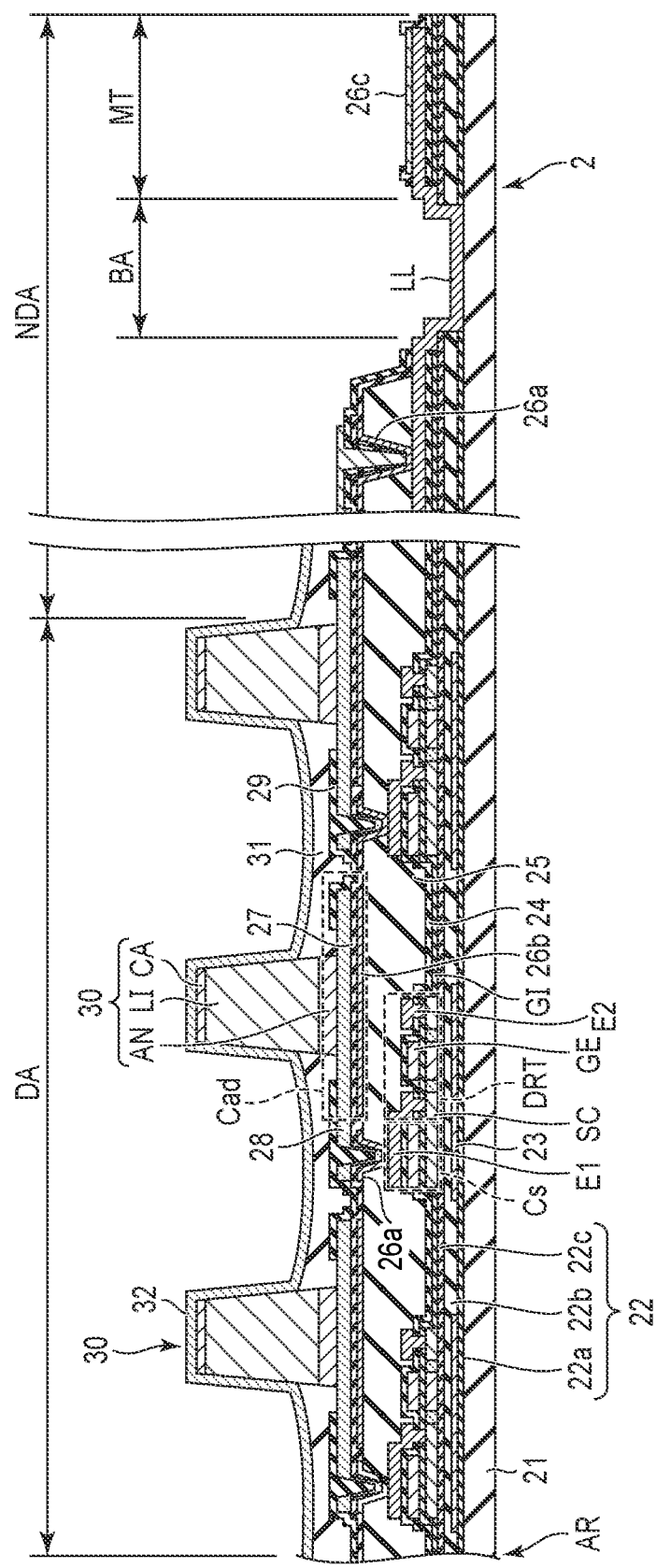
FIG. 3 illustrates a schematic view of another example of a cross-sectional structure of the display device.

In general, according to one embodiment, a display device includes a display area including a plurality of pixels arranged in a matrix and a driver configured to drive the pixels based on an image signal. Each of the pixels includes a light emitting element and a drive transistor to control a current value to the light emitting element. The drive transistor and the light emitting element are connected in series between a first power potential and a second power potential having a potential different from the first power potential. The image signal to drive the pixels includes a first luminance data and a second luminance data. The first luminance data is based on an average value of a gradation value of pixels included in one area of the display area divided into a plurality of areas. The first luminance data is common among the pixels included in said one area. The second luminance data is based on a difference between the gradation value of the pixels included in said one area and the average value. The second luminance data in one pixel included in said one area and the second luminance data in another one pixel included in said one area are independent each other. The driver controls a common luminance time of the pixels included in said one area based on the first luminance data, and controls a current value to be supplied to the luminance element of each of the pixels included in said one area based on the second luminance data.

Various embodiments will be explained hereinafter with reference to the accompanying drawings. Note that the disclosure is merely an example, and any embodiment which is conceivable by a person having an ordinary skill in the art within the spirit of the invention is encompassed by a range of the present invention. Furthermore, for better understanding of the explanation, figures may be drawn more schematically as compared to an actual embodiment, and they are merely for clarification. Such schematic illustration does not limit the interpretation of the present invention. In each figure, some of same or similar elements arranged continuously may not be denoted, and the reference numbers may be omitted. Furthermore, in the description and each figure, structural elements which are functionally the same or similar to those have been explained already will be referred to by the same reference numbers and the explanation considered to be redundant will be omitted.

FIG. 1 is a schematic perspective view of the structure of a display device 1 of an embodiment. FIG. 1 illustrates a three dimensional space defined by a first direction X, second direction Y perpendicular to the first direction X, and third direction Z perpendicular to both the first direction X and the second direction Y. Note that the first direction X and the second direction Y are orthogonal to each other; however, they may cross at an angle other than 90°. Furthermore, in the present embodiment, the third direction Z is defined as above, and the opposite direction to the third direction Z is defined as below. A phrase such as a second member above a first member or a second member below a first member may be interpreted as the second member contacting the first member or as the second member being apart from the first member.

Hereinafter, in the present embodiment, a case where the display device 1 is a micro LED display device using micro LEDs which are self-luminous elements will be mainly explained.

As in FIG. 1, the display device 1 includes a display panel 2, first circuit board 3, and second circuit board 4, for example.

The display panel 2 is, for example, rectangular. In the example depicted, the short side EX of the second panel 2 is parallel to the first direction X, and the long side EY of the display panel 2 is parallel to the second direction Y. The main surface of the display panel 2 is parallel to the X-Y plan defined by the first direction X and the second direction Y. The display panel 2 includes a display area DA, and non-display area NDA outside the display area DA. Non-display area NDA includes a terminal area MT. In the example depicted, the non-display area NDA surrounds the display area DA.

The display area DA includes a plurality of pixels PX arranged in a matrix. The pixels PX include light emitting elements (micro LEDs) and switching elements (drive transistors) to drive the light emitting element.

The terminal area MT is disposed along the short side EX of the display panel 2, and includes terminal to electrically connect the display panel 2 to an external device and the like.

The first circuit board 3 is mounted on the terminal area MT and is electrically connected to the display panel 2. The first circuit board 3 is, for example, a flexible printed circuit. The first circuit board 3 includes a driver IC chip (hereinafter referred to as panel driver) 5 to drive the display panel 2, for example. Note that, in the example depicted, the panel driver 5 is disposed above the first circuit board 3; however, it may be disposed below the first circuit board 3. Furthermore, the panel driver 5 may be mounted on an element other than the first circuit board 3 such as the second circuit board 4. The second circuit board 4 is, for example, a flexible printed circuit. The second circuit board 4 is connected to the first circuit board 3 in the lower part thereof, for example.

The panel driver 5 is connected to a control substrate (which is not shown) via the second circuit board 4, for example. The panel driver 5 drives a plurality of pixels PX based on an image signal output from the control substrate, for example, to perform displaying an image on the display panel 2.

Note that the display panel 2 may include a bending area BA which is hatched. The bending area BA is an area where is bent when the display device 1 is accommodated in the casing of an electronic device or the like. The bending area BA is positioned in the terminal area MT side of the non-display area NDA. While the bending area BA is bent, the first circuit board 3 and the second circuit board 4 are arranged in the lower part of the display panel 2 to opposed thereto.

FIG. 2 illustrates a schematic cross-sectional structure of the display device 1. In this example, a case where micro light emitting diode elements which are referred to as micro LEDs as mentioned above are mounted on the pixel electrode as display elements will be explained.

Note that FIG. 2 mainly indicates the display area DA including a thin film transistor (TFT) structuring pixels, terminal area MT, and bending area BA to bend the non-display area NDA (frame area) including the terminal area MT.

An array substrate AR of the display panel 2 of FIG. 2 includes an insulating substrate 21. The insulating substrate 21 is formed of any material resistive to a treatment temperature during the TFT process, which is, for example, quartz, or a glass substrate such as non-alkali glass, or a resin substrate such as polyimide. The resin substrate is flexible, and can be a sheet display of the display device 1. Note that the resin substrate is not limited to polyimide, and may be formed of other resin materials. In consideration of the above, the term insulating substrate 21 may be, preferably, organic insulating layer or resin layer in some cases.

A three-layered undercoat layer 22 is disposed on the insulating substrate 21. The undercoat layer 22 includes a first layer 22a formed of a silicon oxide ($SiO_2$), second layer 22b formed of silicon nitride (SiN), and third layer 22c formed of silicon oxide ($SiO_2$). The lowermost first layer 22a is disposed to improve the adhesion to the insulating substrate 21 which is a base material, the middle second layer 22b is disposed as a block film against water and impurity from the outside, and the uppermost third layer 22c is disposed as a block film to prevent hydrogen atoms contained in the second layer 22b from scattering to the semiconductor layer SC side. Note that the undercoat layer 22 is not limited to the above structure. The undercoat layer 22 may include an additional layer, or may be structured as a single layer or double layers. For example, if the insulating substrate 21 is formed of a glass, the silicon nitride film may be formed directly on the insulating substrate 21 since the silicon nitride film exerts relatively good adhesion.

A light shielding layer 23 is disposed on the insulating substrate 21. The position of the light shielding layer 23 is matched to the position where the TFT is formed later. In the present embodiment, the light shielding layer 23 is formed of a metal. Note that the light shielding layer 23 is formed of a light shielding material such as a black layer. Furthermore, in the present embodiment, the light shielding layer 23 is disposed on the first layer 22a, and is covered with the second layer 22b. Note that, unlike the present embodiment, the light shielding layer 23 may be disposed on the insulating substrate 21, and may be covered with the first layer 22a. With the light shielding layer 23, light entering the channel rear surface of the TFT can be suppressed, and thus, a change to the TFT characteristics caused by the light which may be entering from the insulating substrate 21 side can be suppressed. Furthermore, if the light shielding layer 23 is formed of a conductive layer, a backgate effect can be added to the TFT by applying a predetermined potential to the light shielding layer 23.

The TFT (for example, drive transistor DRT) is formed on the undercoat layer 22. The TFT is, for example, a polysilicon TFT using polysilicon for the semiconductor layer SC. In the present embodiment, the semiconductor layer SC is formed using a low temperature polysilicon. The TFT may be NchTFT or PchTFT. Furthermore, NchTFT and PchTFT may be formed at the same time. Hereinafter, a case where NchTFT is used as the drive transistor DRT will be explained. The NchTFT semiconductor layer SC includes a first area, second area, channel area between the first and second areas, and low concentration impurity area between the channel area and the first area and between the channel area and the second area. One of the first and second areas functions as a source area, and the other functions as a drain area. A silicone oxide film is used for the gate insulating film GI, and the gate electrode GE is formed of molybdenum tungsten (MoW). Note that a line and an electrode formed on the gate insulating film GI such as gate electrode GE may be referred to as first line or first metal. The gate electrode GE includes a function as a gate electrode of the TFT and as a capacitance electrode which will be described later. An example of the top gate type TFT is explained here; however, the TFT may be a bottom gate type TFT.

An interlayer insulating film 24 is disposed on the gate insulating film GI and the gate electrode GE. The interlayer insulating film 24 is formed on the gate insulating film GI and the gate electrode GE as a silicon nitride film and a silicon oxide film layered in this order, for example. The gate insulating film GI and the interlayer insulating film 24 are not provided with the bending area BA. Thus, after the gate insulating film GI and the interlayer insulating film 24 are formed on the entire area on the insulating substrate 21 including the bending area BA, patterning is performed to the gate insulating film GI and the interlayer insulating film 24 to remove at least the part corresponding to the bending area BA of the gate insulating film GI and the interlayer insulating film 24. Furthermore, with removal of the interlayer insulating film 24, the undercoat layer 22 is exposed, and thus, the patterning is performed to the undercoat layer 22 to remove the part corresponding to the bending area BA. After removing the undercoat layer 22, polyimide of the insulating substrate 21 is exposed, for example. Note that, through etching of the undercoat layer 22, the upper surface of the insulating substrate 21 may be partially eroded or lost.

In that case, a line pattern may be formed in the lower layer of each of the step part at the end of the interlayer insulating film 24 and the step part at the end of the undercoat layer 22. Thereby, when a leading line LL formed in the next step crosses the step part, it passes over the line pattern. The gate electrode GI is disposed between the interlayer insulating film 24 and the undercoat layer 22, and the light shielding layer is disposed between the undercoat layer 22 and the insulating substrate 21, for example, and thus, the line pattern can be formed using these layers.

On the interlayer insulating film 24, a first electrode E1, second electrode E2, and leading line LL are formed. Each of the first electrode E1, second electrode E2, and leading line LL is formed as a triple layer structure (Ti/Al/Ti), including a lower layer formed of a metal material formed of titanium (Ti) or a metal material mainly including Ti such as Ti alloy, middle layer formed of aluminum (Al) or a metal material mainly including Al such as Al alloy, and upper layer formed of Ti or a metal material mainly including Ti such as Ti alloy. Note that the line and electrode formed on the interlayer insulating film 24 such as the first electrode E1 may be referred to as second line or second metal. The first electrode E1 is connected to a first area of the semiconductor layer SC, and the second electrode E2 is connected to a second area of the semiconductor layer SC. For example, if the first area of the semiconductor layer SC functions as a source area, the first electrode E1 is a source electrode, and the second electrode E2 is a drain electrode. The first electrode E1 forms capacitance Cs together with the interlayer insulating film 24 and the gate electrode (capacitance electrode) GE of TFT. The leading line LL extends to the end part of the periphery of the insulating substrate 21 to form a terminal to connect the first circuit board 3 and the panel driver (driver IC) 5.

Note that the leading line LL is formed to cross the bending area BA to reach the terminal part, and thus, it crosses the step parts of the interlayer insulating film 24 and the undercoat layer 22. As mentioned above, the line pattern of the light shielding layer 23 is formed at the step parts, and thus, even if the leading line LL is cut at a concave part of the step, the conductivity can be maintained since the leasing line LL contacts the line pattern below.

A flattening film 25 is formed on the interlayer insulating film 24, first electrode E1, second electrode E2, and leading line LL to cover the TFT and the leading line LL. The flattening film 25 is, in many cases, formed of an organic insulating material such as photosensitive acryl. As compared to an inorganic insulating material formed of CVD or the like, it exerts better coverage of steps of lines and surface flattening.

The flattening film 25 is removed at the pixel contacting part and its periphery. On the flattening film 25, a conductive layer 26 is formed. The conductive layer 26 is formed of ITO, for example, as an oxidant conductive layer. The conductive layer 26 includes a conductive layer 26a which covers the part where the first electrode E1 and the leading line LL are exposed as a result of removal of the flattening film 25. The flattening film 25 and the conductive layer 26 are covered with an insulating layer 27. The insulating layer 27 is formed of, for example, a silicon nitride film. On the insulating layer 27, a pixel electrode 28 is formed. The pixel electrode 28 contacts the conductive layer 26a via an opening of the insulating layer 27 to be electrically connected to the first electrode E1. In this example, the pixel electrode 28 is a connection terminal to mount a light emitting element 30. The pixel electrode 28 is formed as a single-layered conductive layer or two or more layered laminated conductive substance. In the present embodiment, the pixel electrode 28 has a double layered structure (Al/Mo) including a lower layer formed of Mo or a metal material mainly including an Mo alloy and an upper layer formed of Al or a metal material mainly including an Al alloy. In the pixel part, the conductive layer 26 includes a conductive layer 26b. The conductive layer 26b, insulating layer 27, and pixel electrode 28 form auxiliary capacitance Cad. Note that the conductive layer 26 includes a conductive layer 26c forming the surface of the terminal part. One of the purposes of the conductive layer 26a is to be a barrier film to prevent damage to the exposed parts of the first electrode E1 and the leading line LL in a manufacturing process.

On the insulating layer 27 and the pixel electrode 28, an insulating layer 29 is formed. The insulating layer 29 is formed of, for example, a silicon nitride. The insulating layer 29 insulates the end part of the pixel electrode 28 and includes an opening on a part of the surface of the pixel electrode 28 to mount a light emitting element (micro LED) 30. The size of the insulating layer 29 is one size larger than the light emitting element 30 in consideration of shifting in the mount process of the light emitting element 30, for example. For example, the light emitting element 30 is formed as 10×10 μm, the opening is formed, preferably, as 20×20 μm.

In the display area DA, the light emitting element 30 is mounted on an array substrate AR. The light emitting element 30 includes anode AN, cathode CA, and light emitting layer Ll. The light emitting element 30 is prepared to emit light of R or G or B, and the anode side terminal contacts a corresponding pixel electrode 28 and is fixed thereon. The contact between the anode AN of the light emitting element 30 and the pixel electrode 28 is not limited specifically as long as good conductivity is secured therebetween, and the array substrate AR is not damaged. For example, the contact can be achieved by a reflow process using a low temperature melting soldering material, a process of mounting the light emitting element 30 on the array substrate AR via a conductive paste and sintering, or a process of forming the surface of the pixel electrode 28 and the anode AN of the light emitting element 30 with the same material and fixing them by ultrasound bonding.

The light emitting element 30 includes a cathode CA in the opposite side of the anode AN contacting the pixel electrode 28. On the array substrate AR where the light emitting element 30 is formed, an element insulating layer 31 is disposed. The element insulating layer 31 is formed of a resin material charged in a space between the light emitting elements 30 on the array substrate AR. The element insulating layer 31 exposes the surface of the cathode CA of the light emitting element 30. A counter electrode 32 is formed on the surface of the cathode CA of the counter electrode 32 and the element insulating layer 31, contacting the cathode CA, and electrically connected to the cathode CA. The counter electrode 32 is required to be formed as a transparent electrode to extract exit light from the light emitting element 30, and is formed of ITO, for example, as a transparent conductive material. Note that the conductive layer 26 formed of ITO may be referred to as first ITO, and the counter electrode 32 formed of ITO may be referred to as second ITO. The counter electrode 32 connects the cathodes CA of the light emitting elements 30 amounted on the display area DA and is connected to the line on the cathode contact part provided with the outside of the display area DA in the array substrate AR side.

On the other hand, if the side wall part of the light emitting element 30 is insulated by a protection film or the like, a space is not necessarily charged with a resin material or the like, and the resin material at least insulates the anode AN and the surface of the pixel electrode 28 exposed from the anode AN. In that case, as in FIG. 3, the element insulating layer 31 is formed with a thickness not to reach the cathode CA of the light emitting element 30, and then, the counter electrode 32 is formed. On the surface where the counter electrode 32 is formed, asperity caused by the mounting process of the light emitting element 30 partially resides; however, the material forming the counter electrode 32 is laid to continuously cover without cut.

As described above, the array substrate AR extends from the insulating substrate 21 to the counter electrode 32. The display device 1 using the light emitting elements 30 as the display elements is, for example, structured as above in the present embodiment. Note that, a case where the pixel electrode 28 is connected to the drive transistor DRT is used in the explanation of FIG. 2 for convenience. Note that, as will be described later with reference to FIG. 4, the pixel electrode 28 may be electrically connected to the drive transistor DRT via a PWM control transistor EM. If necessary, a cover member such as a cover glass or a touch panel substrate or the like may be disposed on the counter electrode 32. The cover member or the touch panel substrate may be provided via a filler using a resin or the like to charge a space between the counter electrode 32 and the display device 1.

If the display device 1 is a micro LED display device as described above, the efficiency of the light emission of micro LEDs of the micro LED display device changes depending on the density of current flowing to the micro LEDs. Thus, in the display device 1 of the present embodiment, while current which can achieve the high light emitting efficiency is supplied to the light emitting element (micro LEDs), a pulse width modulation (PWM) control is performed to modulate the pulse width of the current in order to achieve gradation of each pixel of the display device 1.

Figure 4:
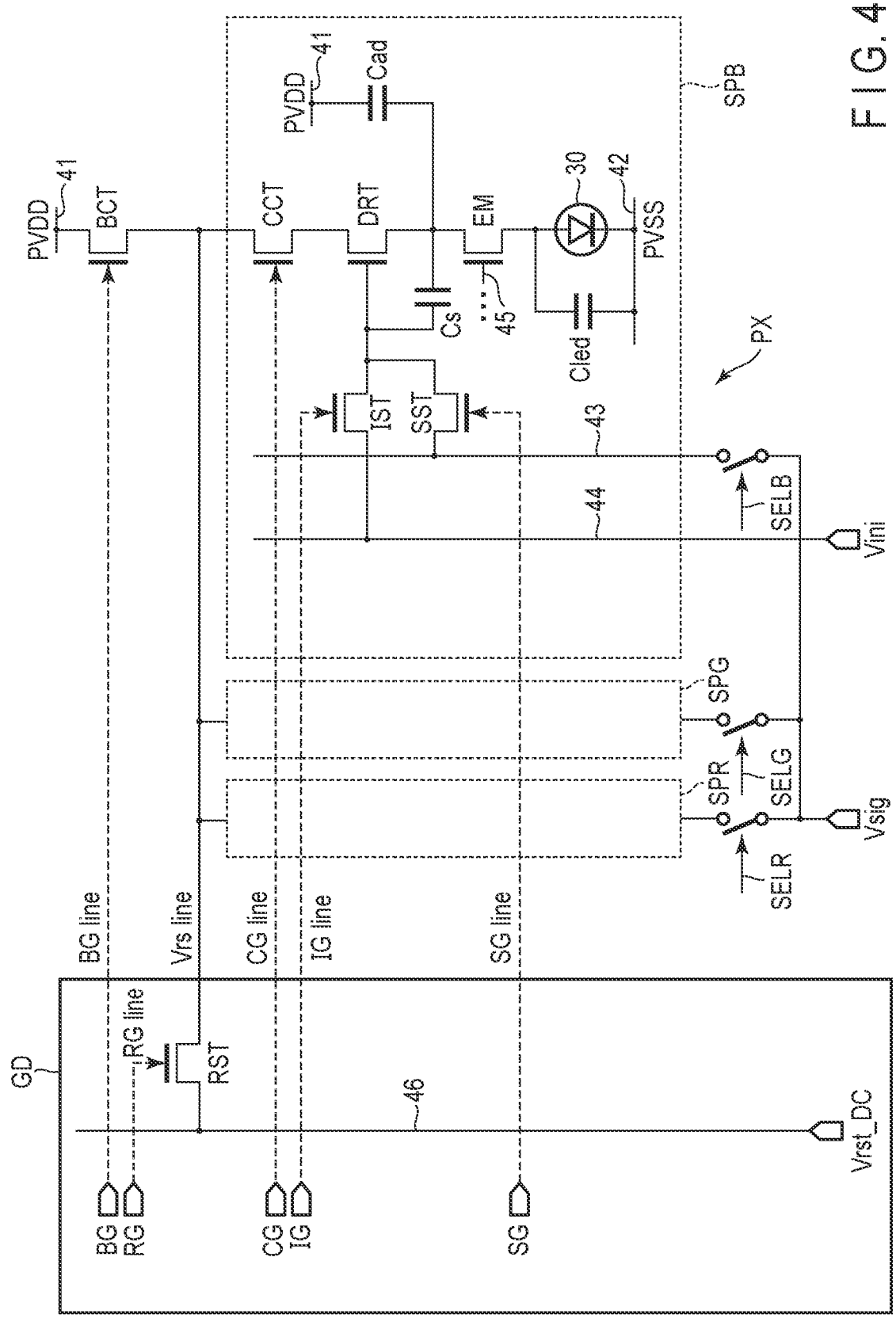
FIG. 4 illustrates an example of the circuit structure of the display device.

Now, the circuit structure of the display device 1 will be explained with reference to FIG. 4. As described above, a plurality of pixels PX are arranged in the display area DA in a matrix. The pixels PX are formed uniformly. Thus, in FIG. 4, one pixel PX is focused for explanation. The pixel PX includes three subpixels SPR, SPG, and SPB.

The subpixels SPR, SPG, and SPB are formed uniformly. Thus, for convenience of explanation, the structure of the subpixel SPB (pixel circuit) will be mainly explained here. As in FIG. 4, the subpixel SPB includes the light emitting element 30, PWM control transistor EM, drive transistor DRT, luminance control transistor CCT, pixel transistor SST, initialization transistor IST, capacitance Cs, and auxiliary capacitance Cad. The gate driver GD includes a reset transistor RST. Note that one output transistor BCT of FIG. 4 is arranged to correspond to the subpixels SPR, SPG, and SPB. In FIG. 4, each transistor is an n-channel transistor. Furthermore, an element capacitance Cled of FIG. 4 is a capacitance between the anode AN and the cathode CA of the light emitting element 30. Note that the PWM control transistor EM, luminance control transistor CCT, reset transistor RST, pixel transistor SST, initialization transistor IST, and output transistor BCT may not be formed as a transistor. The PWM control transistor EM, luminance control transistor CCT, reset transistor RST, pixel transistor SST, initialization transistor IST, and output transistor BCT may be any element to function as a PWM control switch, luminance control switch, reset switch, pixel switch, initialization switch, output switch, respectively. A Vrst line functions as a reset line, and BG, RG, CG, IG, and SG lines function as a control line.

In the following description, one terminal of a source drain terminal of the transistor is a first terminal, and the other is a second terminal. Furthermore, one terminal of the capacitance element is a first terminal and the other is a second terminal.

The PWM control transistor EM is disposed to perform the PWM control of the display device 1, and is connected in series with the drive transistor DRT and the light emitting element 30 between a first main power line 41 (first power potential) and a second main power line 42 (second power potential). Specifically, the first terminal of the PWN control transistor EM is connected to the anode terminal of the light emitting element 30. The second terminal of the PWN control transistor EM is connected to the first terminals of the drive transistor DRT, capacitance Cs, and auxiliary capacitance Cad.

The first terminal of the drive transistor DRT is connected to the second terminal of the PWM control transistor EM, first terminal of the capacitance Cs, and first terminal of the auxiliary capacitance Cad. The second terminal of the drive transistor DRT is connected to the first terminal of the luminance control transistor CCT.

The second terminal of the luminance control transistor CCT is connected to the first terminal of the output transistor BCT. Furthermore, the second terminal of the luminance control transistor CCT is connected to the first terminal of the reset transistor RST via a Vrst line.

The second terminal of the output transistor BCT is connected to the first main power line 41. Furthermore, the cathode terminal of the light emitting element 30 is connected to the second main power line 42.

The first terminal of the pixel transistor SST is connected to the gate terminal of the drive transistor DRT, first terminal of the initialization transistor IST, and second terminal of the capacitance Cs. The second terminal of the pixel transistor SST is connected to a pixel signal line 43.

The second terminal of the initialization transistor IST is connected to an initialization power line 44. The second terminal of the auxiliary capacitance Cad is connected to the first main power line 41. Note that the second terminal of the auxiliary capacitance Cad should be connected to a constant potential line, and may be connected to a constant potential line different from the first main power line 41.

Here, the reset transistor RST is provided with the gate driver GD disposed outside the subpixel SPB (pixel PX), and the second terminal of the reset transistor RST is connected to a reset power line 46.

Here, a first power potential PVDD is supplied to the first main power line 41, and a second power potential PVSS is supplied to the second main power line 42. The first power potential PVDD corresponds to a voltage to supply an anode voltage to the light emitting element 30, and the second power potential PVSS corresponds to a cathode voltage of the light emitting element 30.

Furthermore, an pixel signal Vsig is supplied to the pixel signal line 43, initialization voltage Vini is supplied to the initialization power line 44, and the reset power line 46 is set to reset power potential Vrst. Note that the pixel signal Vsig is signal to be written to the pixel (subpixel SPB in this example) based on the image signal.

Note that the gate terminal of the luminance control transistor CCT is connected to a CG line. A luminance control signal CG is supplied to the CG line.

The gate terminal of the output transistor BCT is connected to a BG line. AN output control signal BG is supplied to the BG line.

The gate terminal of the pixel transistor SST is connected to an SG line. A pixel control signal SG is supplied to the SG line.

The gate terminal of the initialization transistor IST is connected to an IG line. An initialization control signal IG is supplied to the IG line.

The gate terminal of the reset transistor RST is connected to an RG line. A reset control signal RG is supplied to the RG line.

Note that the PWM control line 45 for PWM control is connected to the gate terminal of the PWM control transistor EM. In the PWM control of the present embodiment, through switching between conductivity/non-conductivity of the PWM control transistor EM based on a signal supplied to the PWM control transistor EM (hereinafter referred to as PWM control signal) via the PWM control line 45, the luminance time of the light emitting elements 30 can be controlled.

The transistors mentioned above in FIG. 4 are all n-channel transistors; however, transistors other than the drive transistor DRT may be p-channel transistors, and n-channel transistors and p-channel transistors may be mixed.

Furthermore, the display device 1 includes at least one gate driver GD. In the present embodiment, although this is not shown, the display device 1 includes two data drivers GD. The gate driver GD is disposed in not only the left side of the pixel PX in FIG. 4 but also in the right side thereof. Thus, a signal can be applied to one pixel PX from the gate drivers GD of both sides. Here, a both side power supply method is adopted in the SG line, and a one side power supply method is adopted in the CG, BG, IG, Vrst lines, for example.

The structure of the subpixel SPB has been explained above, and the same applies to subpixels SPR and SPG.

Note that the circuit structure explained above with reference to FIG. 4 is an example, and other circuit structures including the drive transistor DRT and the PWM control transistor EM may be adopted for the display device 1. For example, a part of the circuit structure of FIG. 4 may be omitted, or other elements may be added thereto.

Figure 5:
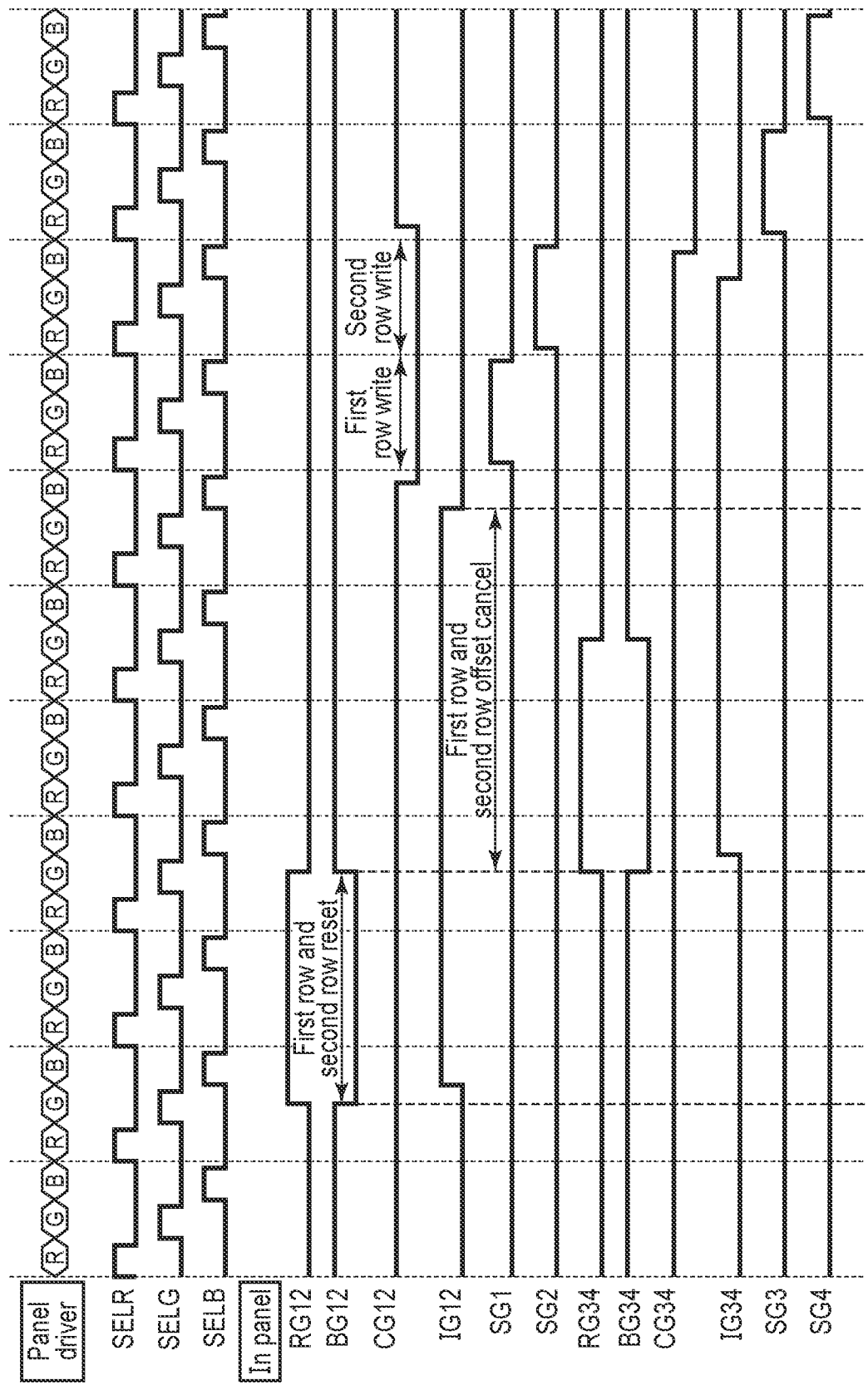
FIG. 5 is a timing chart indicating examples of outputs of various signals related to reset, offset cancel, and write operations in a pixel.
Figure 6:
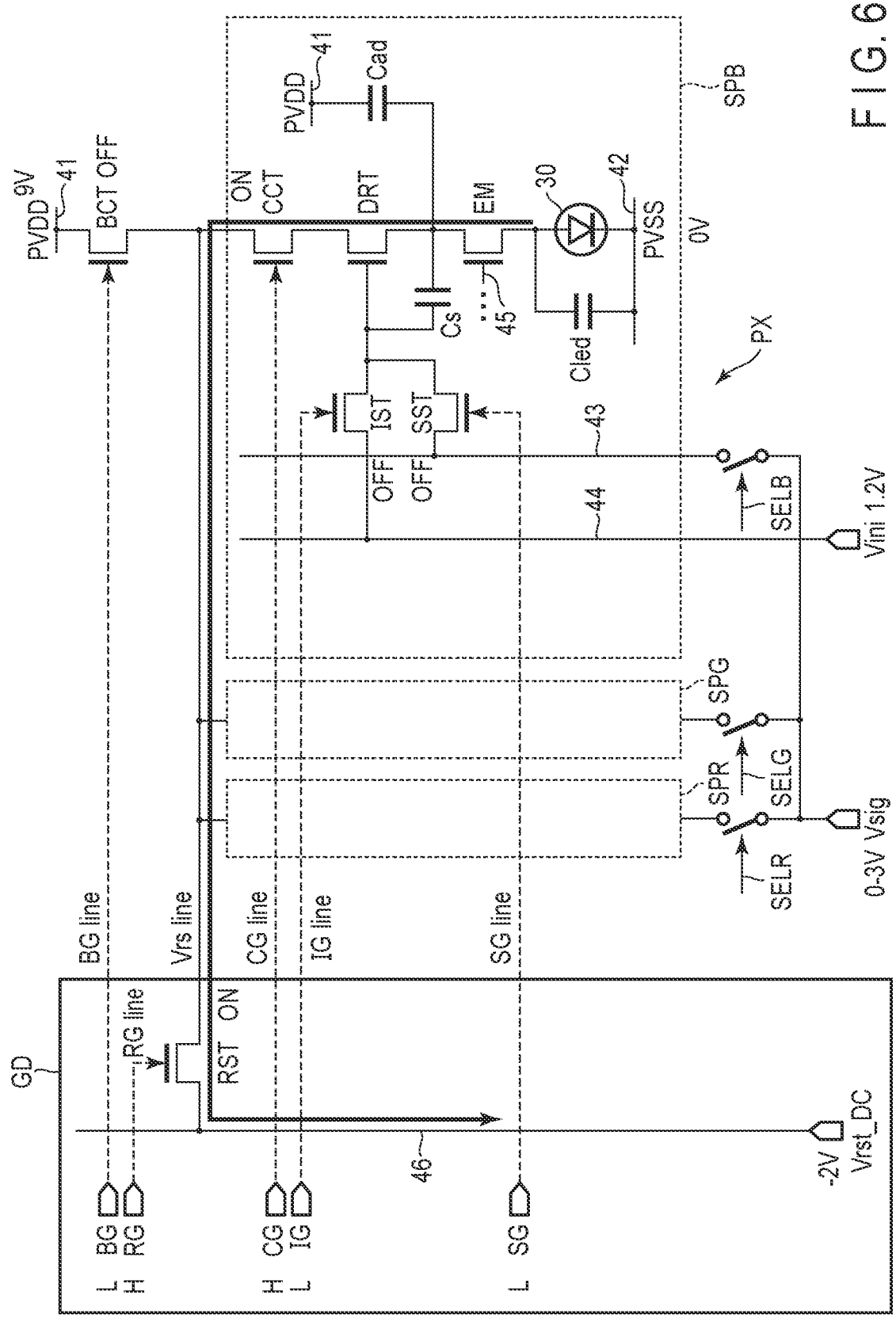
FIG. 6 illustrates an outline of the reset operation in a source side of a drive transistor.

FIG. 5 is a timing chart illustrating examples of outputs of various signals related to reset operation, offset cancel (OC) operation, write operation, and luminance operation in the pixel PX. In this example, signals supplied to the RG, BG, CG, IG, and SG lines will be mainly explained.

Note that the reset operation and the offset cancel operation in a pixel PX are performed per two rows of the pixel PX. In FIG. 5, the RG, BG, CG, and IG lines connected to pixels PX of two rows (hereinafter referred to as first row and second row pixels PX) as targets of the reset operation and the offset cancel operation are RG12, BG12, CG12, and IG12, respectively. Note that the SG line connected to the first row pixel PX is SG1, and the SG line connected to the second row pixel PX is SG2.

Similarly, the RG, BG, CG, and IG lines connected to pixels PX of two rows as targets of the reset operation and the offset cancel operations after the operations to the first row and second row pixels PX (hereinafter referred to as third row and fourth row pixels PX) are RG34, BG34, CG34, and IG34, respectively. Note that the SG line connected to the third row pixel PX is SG3, and the SG line connected to the fourth row pixel PX is SG4.

In FIG. 5, timings of various signals with respect to the first row to fourth row pixels PX are shown, and the same applies to fifth row pixel PX and thereafter.

Now, the order of signals related to the reset operation, offset cancel operation, image signal write operation and luminance operation of the first row and second row pixels PX will be explained. Note that the details of the operations will be described later with reference to FIGS. 6 to 10. The reset operation, offset cancel operation, write operation, and luminance operation in each pixel PX are executed by selecting one of the subpixels SPR, SPG, and SPB (RGB) according to signals (SELR/G/B) output from the panel driver 5.

Furthermore, in the circuit structure of the display device 1, all transistors are n-channel transistors, and if a low (level) signal is supplied to the gate terminal of such a transistor, the transistor becomes an off state (non-conductive state). On the other hand, if a high (level) signal is supplied to the gate terminal of such a transistor, the transistor becomes an on state (conductive state).

Initially, before the reset operation of the capacitance Cs, the output control signal BG of BG 12 becomes low from high, and the reset control signal RG of RG 12 becomes high from low. Thus, current between the first power potential PVDD and the second power potential PVSS via the output transistor BCT is shut, and the output transistor BCT and the anode are reset by a voltage of the Vrst line.

Then, the initialization control signal IG of IG 12 becomes high from low. Thus, the capacitance Cs is reset by an initialization voltage Vini via the initialization transistor IST.

Note that the output control signal BG of BG 12 signal of which is low before the reset of the capacitance Cs becomes high when the reset period of the capacitance Cs is completed. Furthermore, the reset control signal RG of RG 12 becomes low when the reset period of the capacitance Cs is completed.

Furthermore, the initialization control signal IG of IG 12 becomes low when the offset cancel period is completed.

Then, the luminance control signal CG of CG 12 becomes low from high. Thus, the current between the first power potential PVDD and the second power voltage PVSS via the luminance control transistor CCT is shut.

Concurrently, the pixel control signal SG of SG 1 becomes high from low. In that case, current corresponding to the pixel signal Vsig flows to the capacitance Cs and the like through the pixel transistor SST via the pixel signal line 43, and electrostatic capacitance corresponding to the pixel signal Vsig is accumulated in the capacitance Cs. Thus, the write operation to the first row pixel PX (subpixels SPR, SPG, and SPB) is completed.

Then, the pixel control signal SG of SG 2 becomes high from low. In that case, current corresponding to the pixel signal Vsig flows to the capacitance Cs and the like through the pixel transistor SST via the pixel signal line 43, and electrostatic capacitance corresponding to the pixel signal Vsig is accumulated in the capacitance Cs. Thus, the write operation to the second row pixel PX (subpixels SPR, SPG, and SPB) is completed.

When the write operation is completed, the current flows to the light emitting element 30 according to the current value determined based on the pixel signal Vsig, and the light emitting element 30 emits light.

In this example, the order of the signals related to the reset operation, offset cancel operation, write operation, and luminance operation of the first row and second row pixels PX is explained, and the same applies to the reset operation, offset cancel operation, write operation, and luminance operation of the third row and fourth row pixels PX.

In FIG. 5, the reset operation and the offset cancel operation are performed per two rows (that is, two rows at once), and with such a structure, reduction of the frame area and the power can be achieved, for example.

Hereinafter, the outline of the operation of the display device 1 will be explained with reference to FIGS. 6 to 10. Initially, the reset operation of the driver transistor DRT in the source side will be explained with reference to FIG. 6.

Note that, in the following description, the first terminal of the drive transistor DRT connected to the first terminal of the capacitance Cs is a source terminal, and the second terminal of the drive transistor DRT connected to the first terminal of the luminance control transistor CCT is a drain terminal.

When the reset operation is performed in the source side of the drive transistor DRT, the output control signal BG is low (BG=L), reset control signal RG is high (RG=H), luminance control signal CG is high (CG=H), initialization control signal IG is low (IG=L), and pixel control signal SG is low (SG=L).

Thus, the output transistor BCT is OFF state (BCT=OFF), reset transistor RST is ON state (RST=ON), luminance control transistor CCT is ON state (CCT=ON), initialization transistor IST is OFF state (IST=OFF), and pixel transistor SST is OFF state (SST=OFF). In the source reset operation, the reset transistor RST is switched to ON state.

Here, when the PWM control transistor EM becomes ON state, the potential of each of the source terminal and the drain terminal of the drive transistor DRT is reset to the same potential as the reset power potential Vrst, and the source reset operation is completed.

Note that the reset power potential Vrst is set to be lower than the second power potential PVSS, for example. Specifically, the reset power voltage Vrst is set to −2 V.

In the source reset operation, regardless of ON/OFF state of the drive transistor DRT, the source terminal of the drive transistor DRT is −2 V (reset power potential Vrst), and the drive transistor DRT becomes ON state. Note that the minimum value of the pixel signal Vsig is 0 V. The light emitting element 30 in the anode side becomes −2 V, which is lower than the cathode side, and the light emitting element 30 is turned off.

Note that the voltage by the pixel signal Vsig written in the prior frame is held in the capacitance Cs, and the second terminal of the capacitance Cs is in an electrically floating state, and thus, charge/discharge of the capacitance Cs is not performed, and the potential of the second terminal changes corresponding to a change of the potential of the first terminal of the capacitance Cs.

Figure 7:
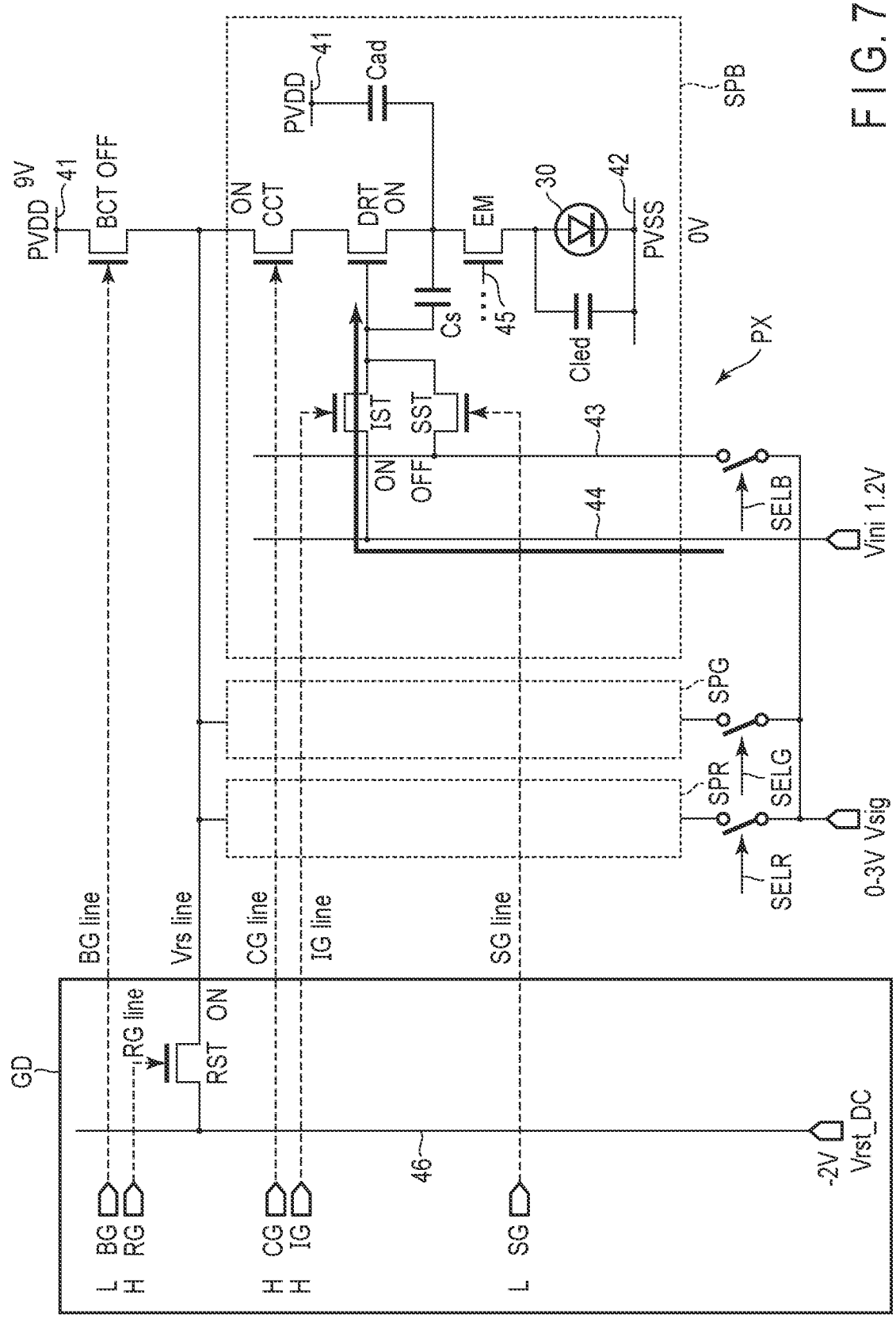
FIG. 7 illustrates an outline of the resent operation in a gate side of the drive transistor.

Now, the reset operation of the drive transistor DRT in the gate side will be explained with reference to FIG. 7.

When the reset operation is performed in the gate side of the drive transistor DRT, the output control signal BG is low (BG=L), reset control signal RG is high (RG=H), luminance control signal CG is high (CG=H), initialization control signal IG is high (IG=H), and pixel control signal SG is low (SG=L).

Thus, the output transistor BCT is OFF state (BCT=OFF), reset transistor RST is ON state (RST=ON), luminance control transistor CCT is ON state (CCT=ON), initialization transistor IST is ON state (IST=ON), and pixel transistor SST is OFF state (SST=OFF). That is, the initialization transistor IST is switched to ON state, and the gate reset operation is started.

In that case, the reset power voltage Vrst is supplied to the source terminal of the drive transistor DRT and the first terminal of the capacitance Cs, and the initialization voltage Vini is supplied to the gate terminal of the drive transistor DRT via the initialization transistor IST. Thus, the potential of the gate terminal of the drive transistor DRT is reset to the potential corresponding to the initialization voltage Vini, and the data of the prior frame is reset.

Here, the initialization voltage Vini is set to be higher than the reset power voltage Vrst. For example, the initialization voltage Vini is +1.2 V. In the gate reset operation, the potential of the gate terminal (Vini) with respect to the potential of the source terminal (Vrst) becomes high, and the drive transistor DRT becomes ON state.

Furthermore, during this period, the charge based on a potential difference between the reset power potential Vrst and the initialization voltage Vini is held in the capacitance Cs. Note that, even if the drive transistor DRT is ON state, the output transistor BCT is OFF state, and thus, the light emitting element 30 is not turned on (not luminous) in the gate reset operation of FIG. 7.

Figure 8:
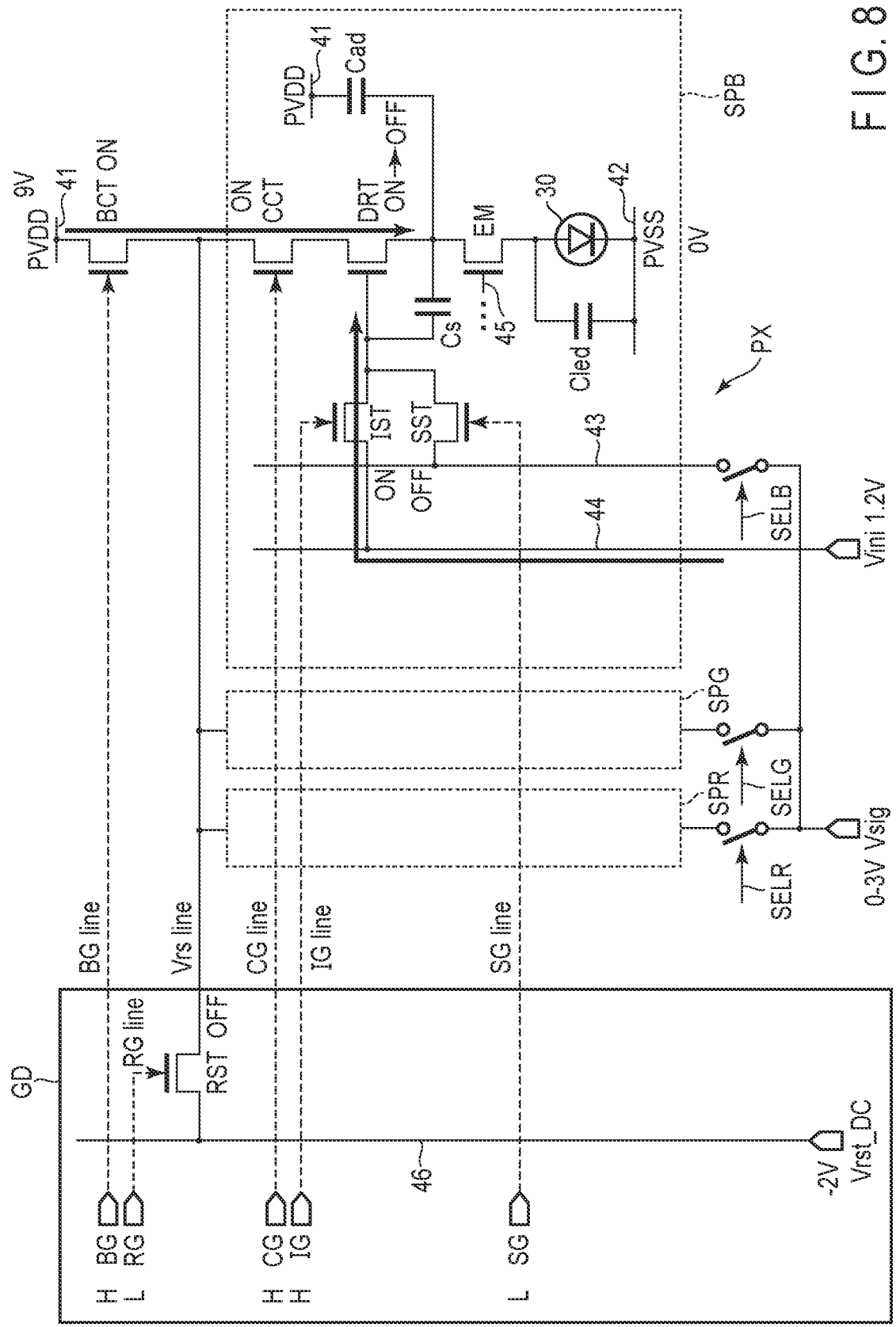
FIG. 8 illustrates an outline of the offset cancel operation.

Now, the offset cancel operation will be explained with reference to FIG. 8. In the offset cancel operation, the output control signal BG is high (BG=H), reset control signal RG is low (RG=L), luminance control signal CG is high (CG=H), initialization control signal IG is high (IG=H), and pixel control signal SG is low (SG=L).

Thus, the output transistor BCT is ON state (BCT=ON), reset transistor RST is OFF state (RST=OFF), luminance control transistor CCT is ON state (CCT=ON), initialization transistor IST is ON state (IST=ON), and pixel transistor SST is OFF state (SST=OFF). That is, the output transistor BCT is switched to ON state, and the reset transistor RST is switched to OFF state.

In that case, the first power potential PVDD is supplied to the drain terminal of the drive transistor DRT via the output transistor BCT.

Here, since the drive transistor DRT is ON state, current flows in the channel of the drive transistor DRT by the first power potential PVDD supplied to the drain terminal of the drive transistor DRT, and the potential of the source terminal of the drive transistor DRT increases. Then, when a difference between the potential of the source terminal and the potential of the gate terminal of the drive transistor DRT reaches a threshold voltage (Vth) of the drive transistor DRT, the drive transistor DRT becomes OFF state. In other words, the voltage between the gate terminal and the source terminal of the drive transistor DRT reaches a cancel point (Vgs=Vth), and the potential difference corresponding to the cancel point is held in the capacitance Cs.

Specifically, the initialization voltage Vini is supplied to the gate terminal of the drive transistor DRT, and when the potential of the source terminal of the drive transistor DRT reaches Vini-Vth, the drive transistor DRT becomes OFF state. Thus, an offset for variations of Vth of the drive transistor DRT occurs between the gate and source of the drive transistor DRT. Thus, the offset cancel operation of the threshold value of the drive transistor DRT is completed.

Now, the write operation of the image signal (pixel signal Vsig) will be explained with reference to FIG. 9.

In the write operation, the output control signal BG is high (BG=H), reset control signal RG is low (RG=L), luminance control signal CG is low (CG=L), initialization control signal IG is low (IG=L), and pixel control signal SG is high (SG=H).

Thus, the output transistor BCT is ON state (BCT=ON), reset transistor RST is OFF state (RST=OFF), luminance control transistor CCT is OFF state (CCT=OFF), initialization transistor IST is OFF state (IST=OFF), and pixel transistor SST is ON state (SST=ON). That is, the luminance control transistor CCT and the initialization transistor IST are switched to OFF state, and the reset transistor RST is switched to ON state.

In that case, the pixel signal Vsig is written in the gate of the drive transistor DRT via the pixel transistor SST.

Here, the source of the drive transistor DRT has different potential per value of Vth by the offset cancel operation, and thus, the voltage Vgs of the drive transistor DRT becomes different even if the same image signal is written. In the drive transistor DRT in which the pixel signal Vsig is completed, the voltage Vgs is represented by the following formula 1.

$$Vgs = (Vsig - Vini) \times \frac{(Cled + Cad)}{(Cs + Cad + Cled)} + Vth \quad (1)$$

Note that, as explained above with reference to FIG. 5, after write to the first row pixel PX is completed, write to the second row pixel PX is performed in a similar manner, for example. If the write to the second row pixel PX is performed, the pixel transistor SST becomes OFF state with respect to the first row pixel PX.

In the above-described write operation, the luminance control transistor CCT is OFF state, and thus, the light emitting element 30 is not turned on (not luminous).

Now, the outline of the luminance operation to turn on the light emitting element 30 will be explained with reference to FIG. 10.

In the luminance operation, the output control signal BG is high (BG=H), reset control signal RG is low (RG=L), luminance control signal CG is high (CG=H), initialization control signal IG is low (IG=L), and pixel control signal SG is low (SG=L).

Thus, the output transistor BCT is ON state (BCT=ON), reset transistor RST is OFF state (RST=OFF), luminance control transistor CCT is ON state (CCT=ON), initialization transistor IST is OFF state (IST=OFF), and pixel transistor SST is OFF state (SST=OFF). That is, the pixel transistor SST is switched to OFF state, and the luminance control transistor CCT is switched to ON state. Note that, in the luminance operation, the PWM control transistor EM becomes ON state for a predetermined period.

In that case, current Iled corresponding to the gate potential of the drive transistor DRT written in the write operation flows to the light emitting element 30 through the drive transistor DRT and the PWM control transistor EM, and the light emitting element 30 is turned on (luminous).

During the luminance period, the current Iled corresponds to output current (output current of a saturated area of the drive transistor DRT) Idrt supplied from the drive transistor DRT (Iled=Idrt). When a gain coefficient of the drive transistor DRT is β, the output current Idrt is represented by the following formula 2.

$$Idrt = \beta \times (Vgs - Vth)^2 \quad (2)$$

By substituting formula 1 to formula 2, the output current Idrt is represented by the following formula 3.

$$Idrt = \beta \times \left\{ (Vsig - Vini) \times \frac{(Cled + Cad)}{(Cs + Cad + Cled)} \right\}^2 \quad (3)$$

Thus, the output current Idrt becomes a value which does not depend on the threshold voltage Vth of the drive transistor DRT, and thus, an influence by variations of the threshold voltage of the drive transistor DRT to the output current Idrt can be removed.

Note that the gain coefficient β is defined as follows.

$$\beta = \tfrac{1}{2} \times Cox \times \mu \times W/L$$

Note that Cox is a gate electrostatic capacitance per unit area, μ is a carrier movement degree, W is a channel width of drive transistor DRT, and L is a channel length of drive transistor DRT.

Here, if the display device 1 is a micro LED display device as described above, since the efficiency of the luminance of the micro LEDs of the micro LED display device differs depending on the current density, it is important that the luminance is controlled by the current density which can achieve the maximum efficiency of luminance per RGB, for example.

In that case, the PWM control performed while the current which can achieve the maximum efficiency of luminance is supplied to the micro LEDs is effective as a gradation control of each pixel PX.

However, when the gradation control of each pixel PX is performed by the PWM control (duty control in PWM) alone, the pixel circuit will be complicated.

Thus, in the present embodiment, the display area DA (that is, a plurality of pixels PX) is divided into a plurality of areas (hereinafter referred to as blocks), and the PWM control is performed per block, and individual gradation of each pixel PX in the block is finely tuned by the current value (Vsig) supplied to the light emitting element 30 included in the pixel PX (subpixels SPR, SPG, and SPB).

Figure 11:
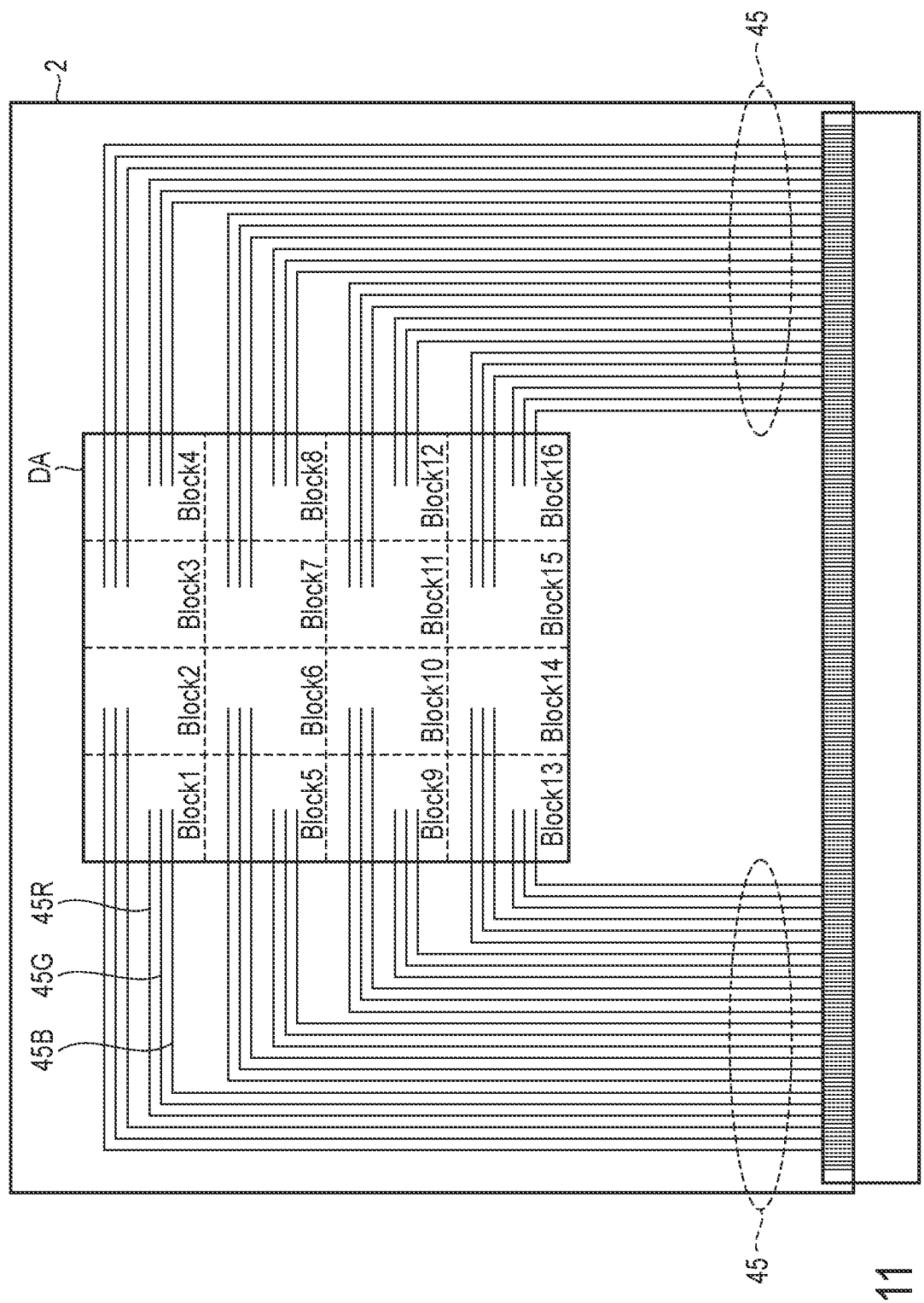
FIG. 11 illustrates an outline of a display area divided into blocks.

The outline of the block will be explained with reference to FIG. 11. As in FIG. 11, the display area DA is divided into a plurality of blocks. FIG. 11 indicates an example where the display area DA is divided into sixteen blocks of Blocks 1 to 16.

Each of the blocks 1 to 16 of the display area DA includes a pixel PX corresponding to the block (area) from the pixels PX arranged in the display area DA in a matrix (that is, corresponding pixel PX is assigned to each block). Note that blocks 1 to 16 each include several pixels PX.

Here, in each of the blocks 1 to 16 of the display area DA, an independent PWM control line 45 is disposed per RGB. Specifically, several pixels PX (hereinafter referred to as pixels PX1) included in the block 1 each include subpixels SPR, SPG, and SPB, and block 1 includes three PWM control lines 45 including one PWM control line 45R connected to all subpixels SPR included in the pixels PX1, one PWM control line 45G connected to all subpixels SPG included in the pixels PX1, and one PWM control line 45B connected to all subpixels SPB included in the pixels PX1 (that is, control lines per RGB). In this example, block 1 is explained, and the same applies to other blocks 2 to 16.

Note that, in the example of FIG. 11, the display area DA is divided into sixteen blocks; however, the display area DA may be divided into a different number of blocks, and the shape of the blocks may be different from the example shown in FIG. 11.

Now, a connection relationship between the PWM control line 45 and the subpixels SPR, SPG, and SPB included in the pixel PX will be explained with reference to FIG. 12. Note that a pixel circuit of the subpixels SPR, SPG, and SPB included in each pixel PX is indicated in FIG. 12, and the pixel circuit therein only indicates the drive transistor DRT, PWM control transistor EM, and light emitting element 30, and other elements are omitted.

Figure 12:
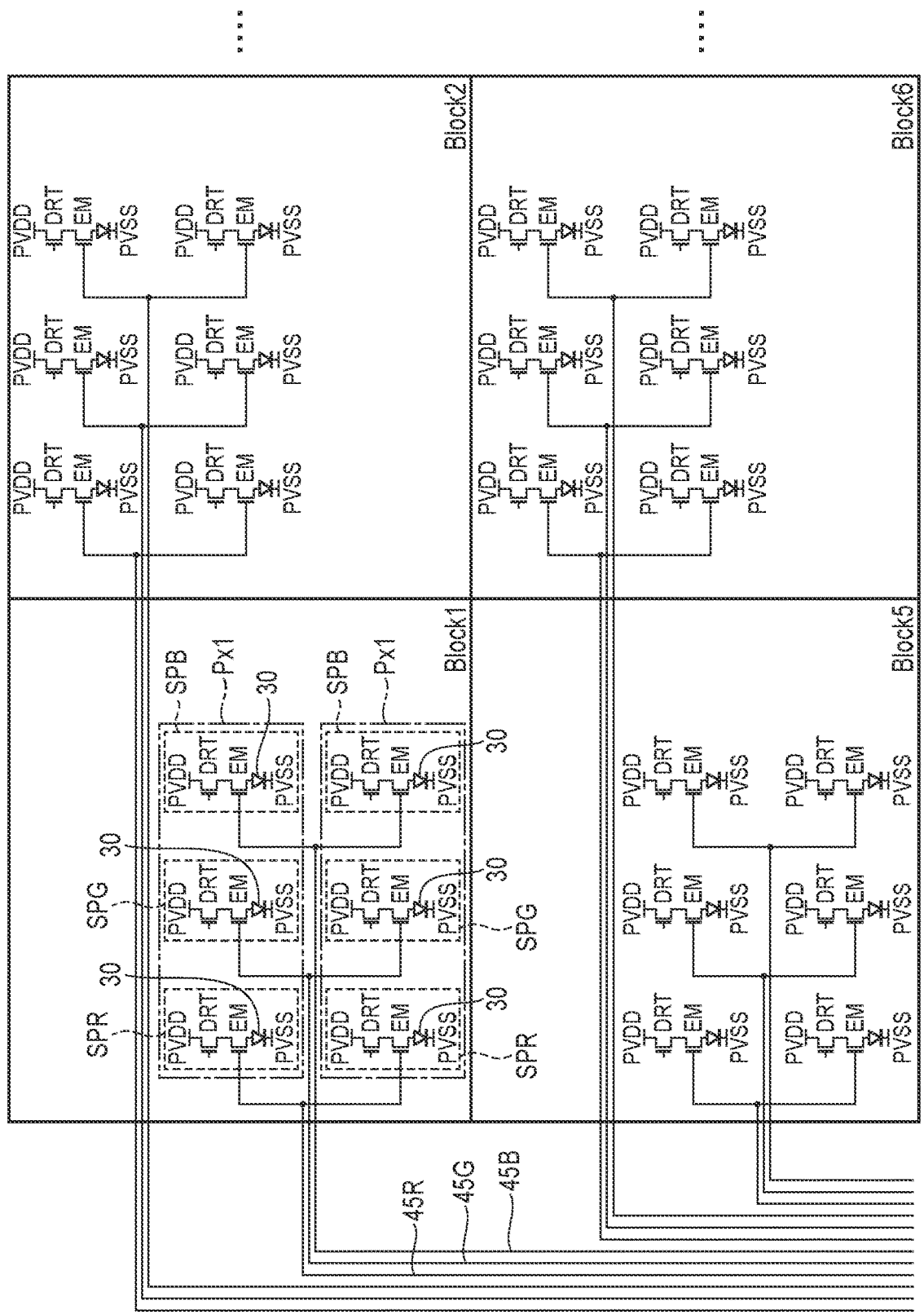
FIG. 12 illustrates a connection relationship between a PWM control line and subpixels included in a pixel.

One end of the PWM control line 45R of FIG. 12 is connected to a gate terminal of the PWM control transistor EM of the subpixel SPR included in each of pixels PX1 included in block 1, for example. In this example, only two pixels PX1 of the pixels PX included in block 1 are shown whereas the PWM control line 45R is similarly connected to the gate terminal of the PWM control transistor EM of the subpixels SPR included in other pixels PX1.

When the PWM control signal which will be described later is supplied to the PWM control line 45R, overall PWM control with respect to the subpixels SPR included in all pixels PX1 in block 1 can be performed.

Furthermore, one end of the PWM control line 45G is connected to the gate terminal of the PWM control transistor EM of subpixels SPG included in each of pixels PX1 included in block 1, for example. In this example, only two pixels PX1 of the pixels PX included in block 1 are shown whereas the PWM control line 45G is similarly connected to the gate terminal of the PWM control transistor EM of the subpixels SPG included in other pixels PX1.

When the PWM control signal is supplied to the PWM control line 45G, overall PWM control with respect to the subpixels SPG included in all pixels PX1 in block 1 can be performed.

Furthermore, one end of the PWM control line 45B is connected to the gate terminal of the PWM control transistor EM of subpixels SPB included in each of pixels PX1 included in block 1, for example. In this example, only two pixels PX1 of the pixels PX included in block 1 are shown whereas the PWM control line 45B is similarly connected to the gate terminal of the PWM control transistor EM of the subpixels SPB included in other pixels PX1.

When the PWM control signal is supplied to the PWM control line 45B, overall PWM control with respect to the subpixels SPB included in all pixels PX1 in block 1 can be performed.

In this example, block 1 is mainly explained, and the same applies to other blocks 2 to 16. Thus, in the present embodiment, the PWM control per RGB block-by-block is performable based on the PWM control signal supplied to each PWM control line 45.

Note that, as described above, one end of the PWM control line 45 is connected to the gate terminals of the PWM control transistors EM of the subpixels SPR, SPG, and SPB while the other end of the PWM control line 45 is connected to the panel driver 5. That is, the PWM control signal for the PWM control is supplied from the panel driver 5.

Here, in the display device 1 of the present embodiment, as described above, the pixel signal Vsig is supplied to the gate terminals of the drive transistors DRT of the subpixels SPR, SPG, and SPB included in each pixel PX.

Figure 13:
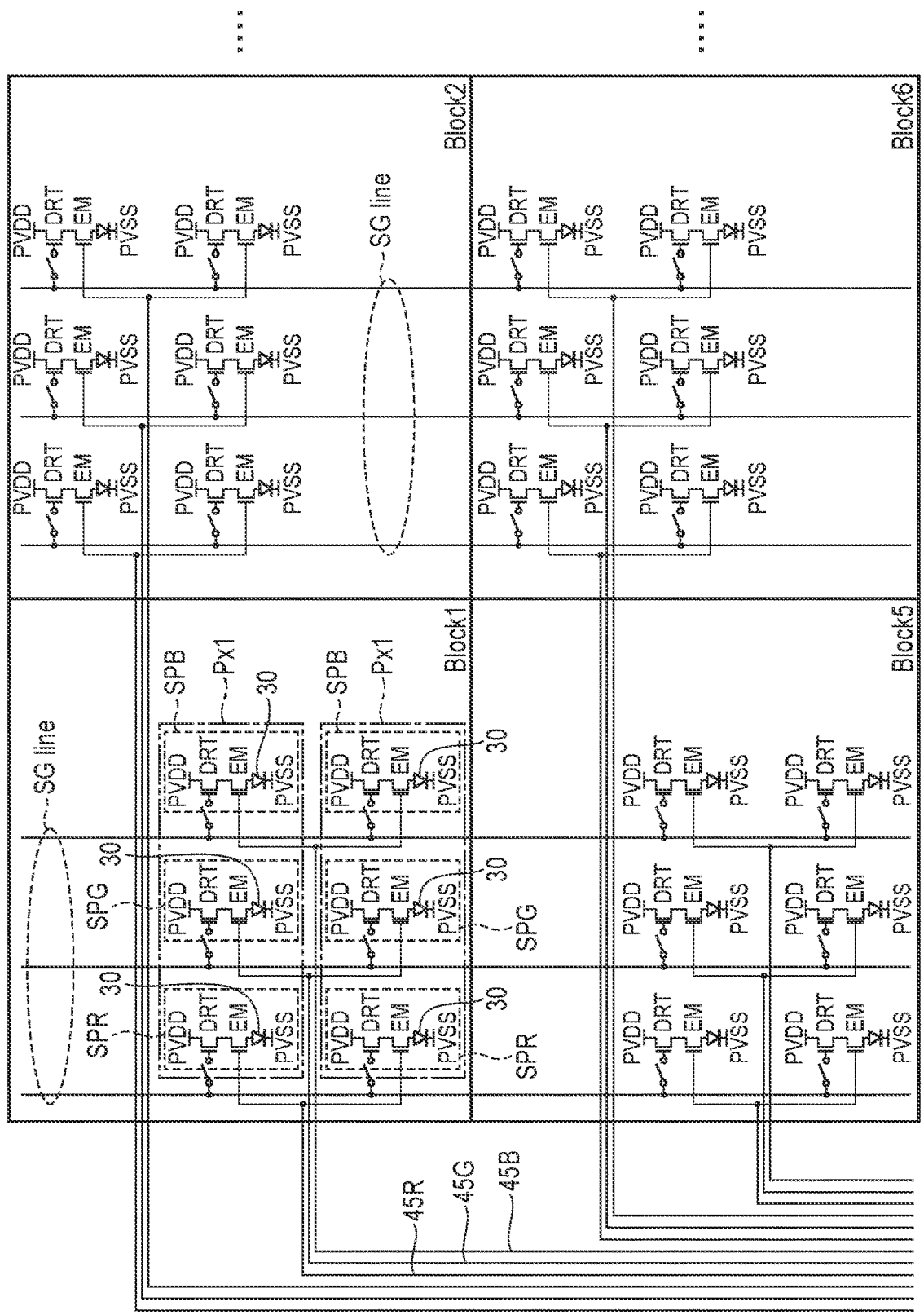
FIG. 13 illustrates a gradation control of the pixel.

Thus, the gradation achieved by the pixels PX in the present embodiment is, as in FIG. 13, controlled by luminosity of the light emitting element 30 of each of subpixels SPR, SPG, and SPB based on the pixel signal Vsig supplied via the pixel transistor SST connected to a SG line, and luminance time of the light emitting element 30 of each of subpixels SPR, SPG, and SPB based on the PWM control signal supplied via the PWM control line 45. Note that the pixel signal Vsig is a signal supplied to each subpixel included in each pixel PX, and the PWM control signal is a signal supplied to each block.

Now, a process performed by the panel driver 5 (driver) will be explained with reference to a flowchart of FIG. 14. Here, a process related to the gradation control will be mainly explained in the process executed by the panel driver 5.

Initially, the panel driver 5 acquires an image signal output from a control substrate (step S1). The image signal includes data of gradation value (luminosity value) of R, G, and B of each pixel PX in frames (image) displayed on the display panel 2.

Then, the following steps S2 and S3 will be executed for each of blocks divided from the display area DA. Hereinafter, a blocks as a target of steps S2 and S3 is referred to as a target block.

Note that steps S2 and S3 are performed per subpixel SPR, SPG, and SPB (that is, RGB) of pixels PX in the target block. Hereinafter, a case where steps S2 and S3 are performed for subpixels SPR included in pixels PX in the target block (hereinafter simply referred to as subpixels SPR in target blocks) will be explained.

In that case, the panel driver 5 calculates, based on the image signal acquired in step S1, an average value of the gradation value of each of the subpixels SPR in the target block (hereinafter referred to as gradation average value) (step S2).

The panel driver 5 determines, based on the gradation average value calculated in step S2, a signal value of PWM control signal supplied to a PWM control transistor EM of subpixels SPR in the target block (hereinafter referred to as PWM control value) (step S3).

Note that the PWM control value determined in step S2 corresponds to a PWM ratio suitable for the subpixels SPR in the target block. In step S2, the PWM control value which can achieve the gradation corresponding to the gradation average value if the PWM control is executed while the current value of maximum efficiency of luminance is supplied to the light emitting elements 30 of the subpixels SPR. The PWM control value is common luminance data between the subpixels SPR in the target block.

In this example, a case where steps S2 and S3 are executed for the subpixels SPR in the target block is explained, and steps S2 and S3 are executed similarly to subpixels SPG and SPB in the target block.

As can be understood from the above, the PWM control value with respect to the PWM control transistor EM per subpixel SPR, SPG, and SPB (that is, per RGB) is determined.

When step S3 is executed, whether or not steps S2 and S3 are executed for all blocks is determined (step S4).

If it is determined that the steps are not executed for all blocks (NO in step S4), the process is repeated from step S2. In that case, steps S2 and S3 are executed for an unprocessed block as a target block.

On the other hand, if it is determined that the steps are executed for all blocks (YES in step S4), the following steps S5 and S6 are executed with respect to all subpixels included in each of pixels PX of the display area DA. Hereinafter, a subpixel as a target of steps S5 and S6 will be referred to as a target subpixel.

In that case, the panel driver 5 calculates a difference between the gradation value of the target subpixel included in the image signal acquired in step S1 and the gradation average value calculated in step S2 with respect to the block including the pixel PX including the target subpixel (gradation average value calculated using the gradation value of the target subpixel) (step S5).

Note that the difference calculated in step S5 corresponds to a difference between the gradation value represented when the PWM control is performed while the current value of the maximum efficiency of luminance is supplied to the light emitting element 30 of the target subpixel (that is, gradation average value), and the gradation value to be represented by the target subpixel based on the image signal.

The panel driver 5 determines, based on the difference calculated in step S5, a signal value of the pixel signal Vsig supplied to the gate terminal of the drive transistor DRT of the target subpixel via the pixel transistor SST (step S6).

In step S6, the difference calculated in step S5 is finely tuned to determine the pixel signal value which allows the target subpixel (light emitting element 30 of the target subpixel) to emit light in the luminosity corresponding to the gradation value to be represented based on the image signal while the PWM control is performed based on the PWM control value. The pixel signal value is luminance data independently (individually) determined with respect to the target subpixel.

When step S6 is executed, whether or not steps S5 and S6 are executed with respect to all subpixels is determined (step S7).

If it is determined that the steps are not executed for all subpixels (NO in step S7), the process is repeated from step S5. In that case, steps S5 and S6 are executed for an unprocessed subpixel as a target subpixel.

On the other hand, if it is determined that the steps are executed for all subpixels (YES in step S7), the panel driver 5 drives pixels PX (subpixels SPR, SPG, and SPB) based on the image signal including the PWM control value (first luminance data) per block determined in step S3 and the pixel signal value (second luminance data) per subpixel determined in step S6 (step S8).

According to the above-described process, the light emitting element 30 of each subpixel is illuminated based on the common PWM control value determined in each block (that is, luminance time determined based on the PWM control value) and the pixel signal value independently determined with respect to each pixel PX (subpixels SPR, SPG, and SPB) in the block (that is, luminosity based on the current value determined by the pixel signal value), and thus, the gradation of the pixel PX is represented based on the image signal.

Figure 14:
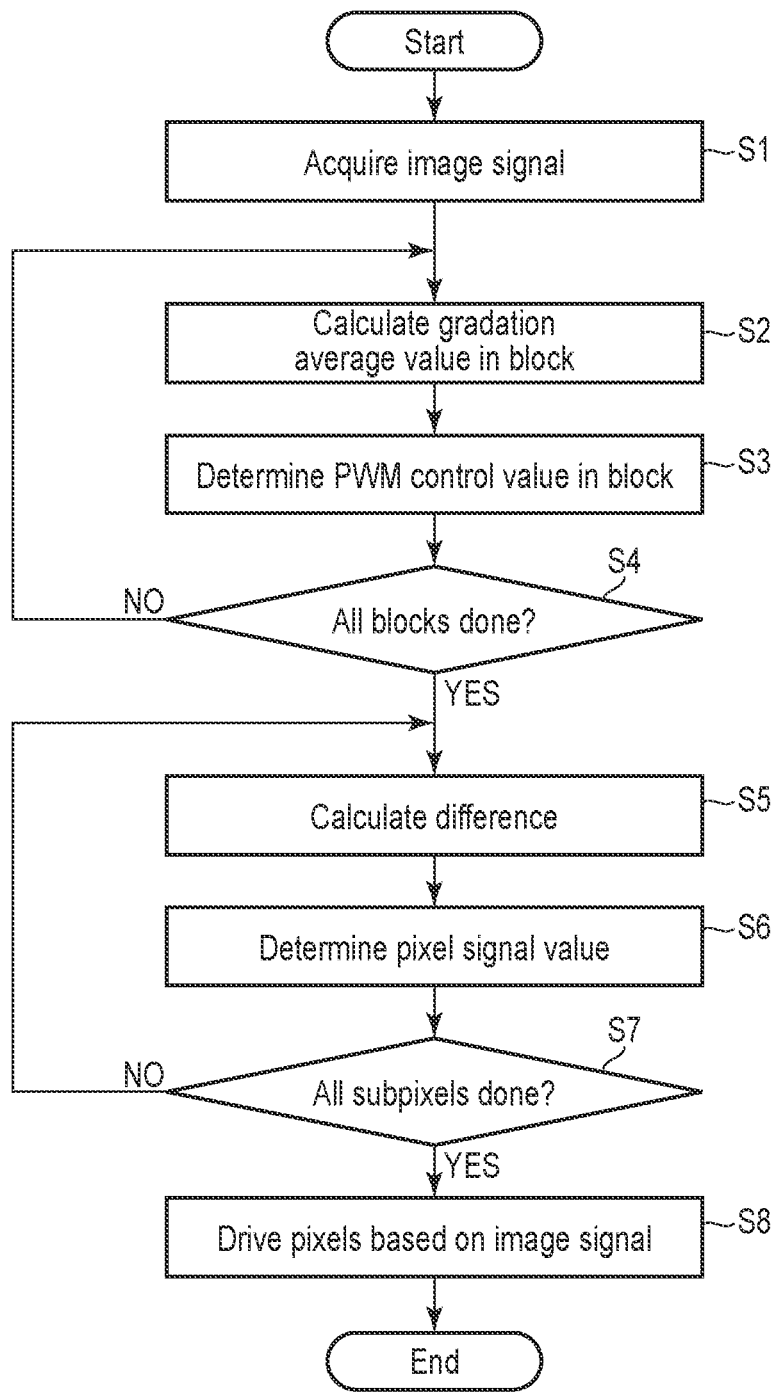
FIG. 14 illustrates an example of a process performed by a panel driver.

Note that the process of FIG. 14 is performed every time when one frame display is performed. That is, the PWM control value (first luminance data) and the pixel signal value (second luminance data) are related to the image signal used for performing one frame display.

Hereinafter, the PWM control performed by the display device 1 of the present embodiment will be explained with reference to FIG. 15. Here, the PWM control with respect to each of subpixels SPR, SPG, and SPB included in pixels PX1 in block 1 of blocks 1 to 16 as in FIG. 11 and the like will be specifically explained.

Figure 9:
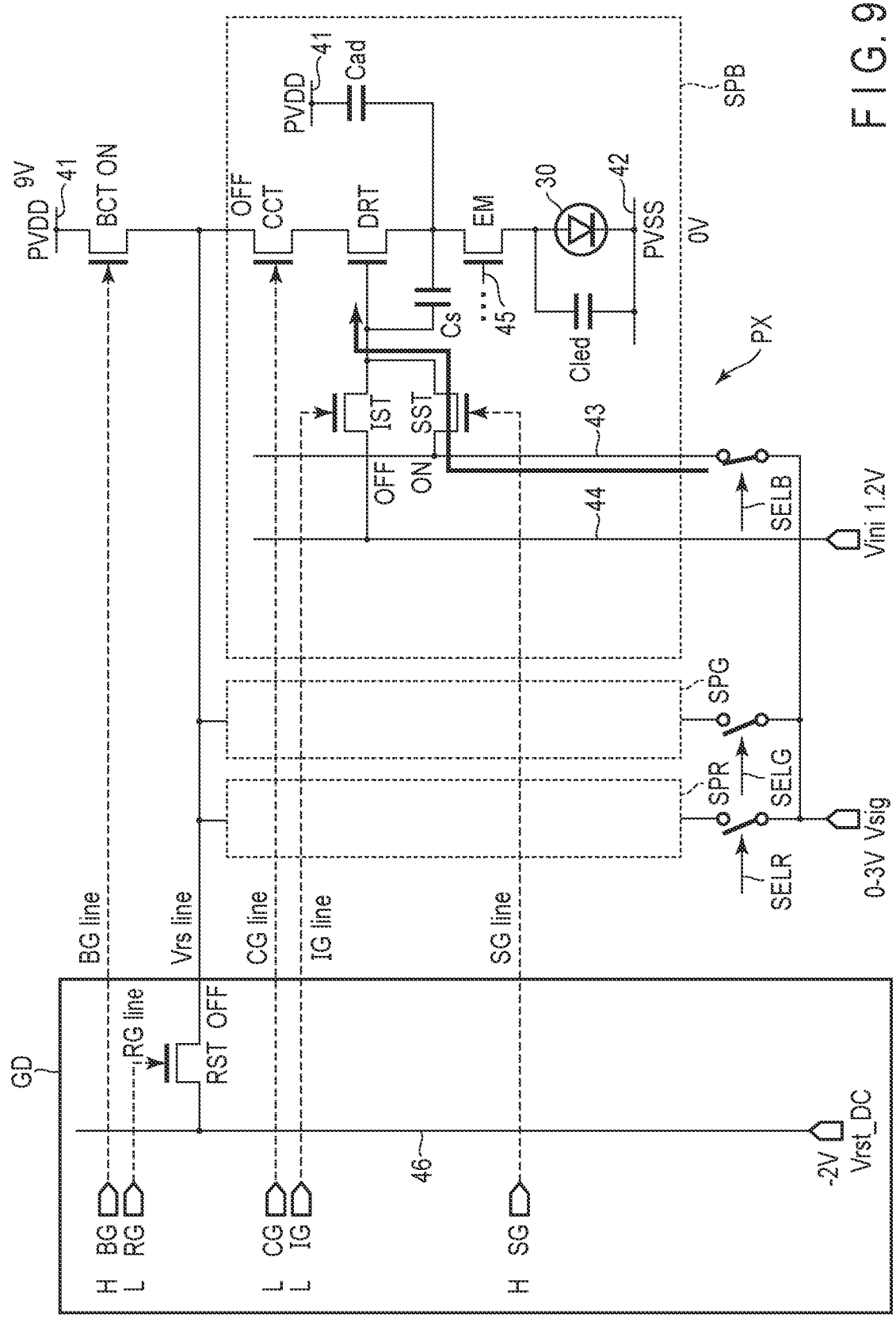
FIG. 9 illustrates an outline of the write operation of image signals.
Figure 15:
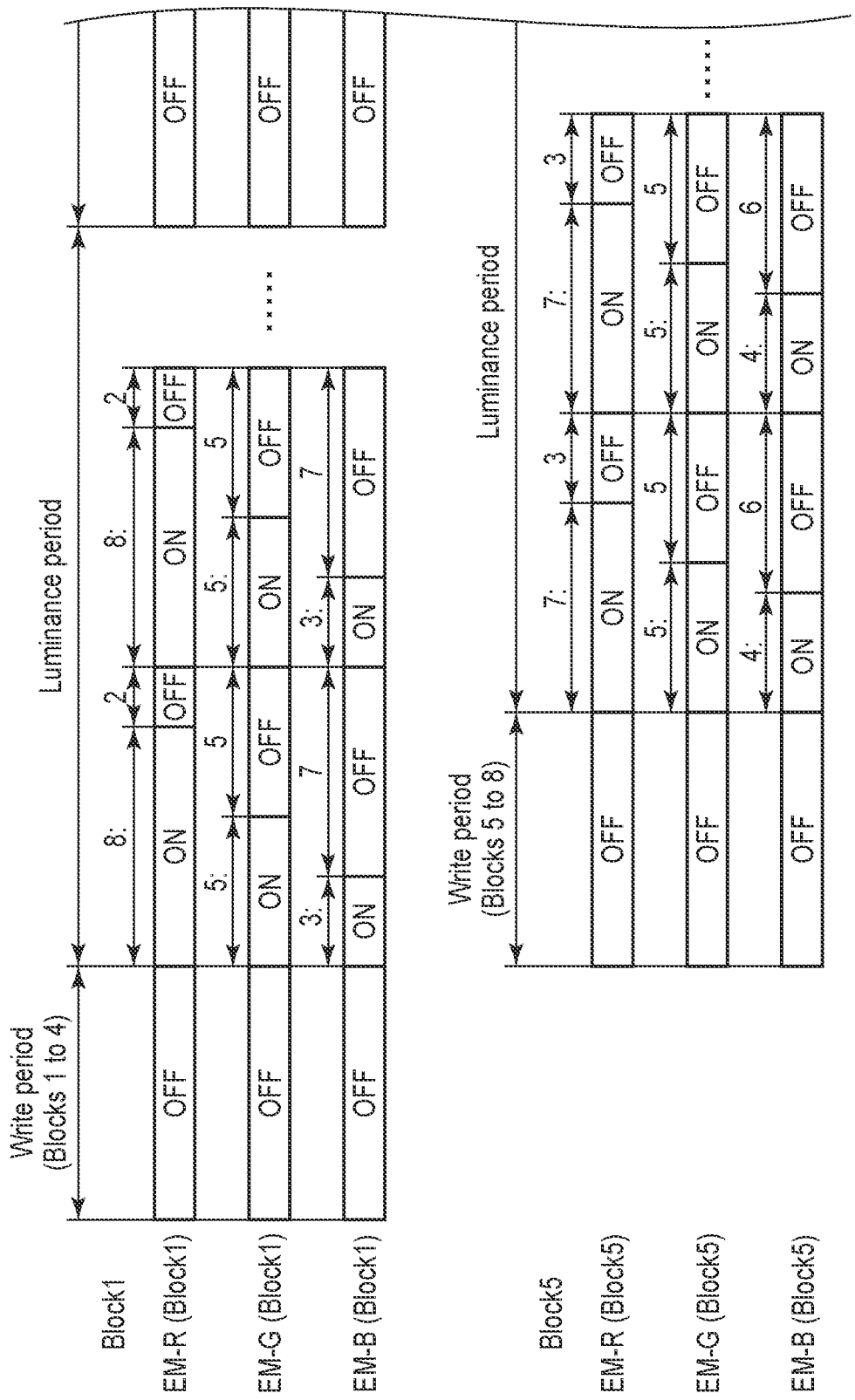
FIG. 15 illustrates PWM control of the display device.

Here, a case where the write operation of image signals as in FIG. 9 is executed in the write period of FIG. 15 will be considered. Note that the write operation is performed per row as described above. Thus, the write operation is performed with respect to pixels PX (subpixels SPR, SPG, and SPB) in blocks 1 to 4 of FIG. 11.

In that case, in each subpixel in block 1, the pixel signal Vsig is written in the gate of the drive transistor DRT through the pixel transistor SST, and the signal value of the pixel signal Vsig written to the gate of the drive transistor DRT is a pixel signal value determined when step S6 of FIG. 14 is executed with respect to the subpixels as target pixels.

When the write operation with respect to pixels PX1 in blocks 1 to 4 is completed (write period ends), the luminance operation as in FIG. 10 is executed in the luminance period of FIG. 15.

In the luminance period, to each PWM control transistor EM of the subpixels SPR, SPG, and SPB in block 1, the PWM control signal is supplied via the PWM control line 45.

Here, in FIG. 15, PWM control transistor EM-R represents a group of PWM control transistors EM of subpixels SPR in block 1. Similarly, PWM control transistor EM-G represents a group of PWM control transistors EM of subpixels SPG in block 1.

Furthermore, PWM control transistor EM-B represents a group of PWM control transistors EM of subpixels SPB in block 1. The PWM control signal is supplied to each of the PWM control transistors EM-R, EM-G, and EM-B as described above.

In the example of FIG. 15, the PWM control signal to allow the light emitting element 30 to emit light in 80% of the luminance period is supplied to the PWM control transistor EM-R. Note that the signal value of the PWM control signal supplied to the PWM control transistor EM-R is the PWM control value determined in step S3 of FIG. 14 executed with respect to the subpixels SPR in block 1 as a target block.

Furthermore, the PWM control signal to allow the light emitting element 30 to emit light in 50% of the luminance period is supplied to the PWM control transistor EM-G. Note that the signal value of the PWM control signal supplied to the PWM control transistor EM-G is the PWM control value determined in step S3 of FIG. 14 executed with respect to the subpixels SPG in block 1 as a target block.

Furthermore, the PWM control signal to allow the light emitting element 30 to emit light in 30% of the luminance period is supplied to the PWM control transistor EM-B. Note that the signal value of the PWM control signal supplied to the PWM control transistor EM-B is the PWM control value determined in step S3 of FIG. 14 executed with respect to the subpixels SPB in block 1 as a target block.

That is, the light emitting element 30 of one subpixel SPR in block 1, for example, emits light based on the pixel signal value individually determined with respect to the subpixel SPR (that is, luminosity of the light emitting element 30 included in the subpixel SPR) and the PWM control value commonly determined with respect to the subpixels SPR in block 1 (that is, luminance time of the light emitting element 30 included in the subpixels SPR) to represent the gradation of the subpixel SPR based on the image signal.

Similarly, the light emitting element 30 of one subpixel SPG in block 1, for example, emits light based on the pixel signal value individually determined with respect to the subpixel SPG (that is, luminosity of the light emitting element 30 included in the subpixel SPG) and the PWM control value commonly determined with respect to the subpixels SPR in block 1 (that is, luminance time of the light emitting element 30 included in the subpixels SPG) to represent the gradation of the subpixel SPG based on the image signal.

Furthermore, the light emitting element 30 of one subpixel SPR in block 1, for example, emits light based on the pixel signal value individually determined with respect to the subpixel SPB (that is, luminosity of the light emitting element 30 included in the subpixel SPB) and the PWM control value commonly determined with respect to the subpixels SPB in block 1 (that is, luminance time of the light emitting element 30 included in the subpixels SPB) to represent the gradation of the subpixel SPB based on the image signal.

That is, in the present embodiment, the gradation of the pixels PX based on the image signal can be represented when the light emitting elements 30 included in each of subpixels SPR, SPG, and SPB of the pixels PX emit light as described above.

Note that FIG. 15 illustrates that the light emitting elements 30 of subpixels SPR, SPG, and SPB repeat turning on/off by the PWM control, and the number of turning on/off repeated by the light emitting element 30 is not limited as long as luminance is performed in the luminance time (PWM ratio) based on the PWM control value with respect to the entire luminance period. Specifically, the light emitting element 30 of the subpixels SPR in block 1 may be continuously turned on in 80% of time from the start of the luminance time and continuously turned off in remaining 20% of time based on the PWM control signal (PWM control value).

In this example, the PWM control with respect to each of subpixels SPR, SPG, and SPB included in pixels PX in block 1 is mainly explained. Note that, when the write operation with respect to the pixels PX in blocks 1 to 4 is completed as described above, the PWM control is performed similarly with respect to subpixels SPR, SPG, and SPB included in pixels PX in blocks 2 to 4.

Furthermore, when the write operation with respect to the pixels PX in blocks 1 to 4 is completed, the write operation with respect to the pixels PX in blocks 5 to 8 is started as in FIG. 15. When the write operation with respect to the pixels PX in blocks 5 to 8 is completed, the luminance period of the pixels PX in blocks 5 to 8 starts. Note that the operation during the luminance period is similar to that of blocks 1 to 4. Furthermore, the same applies to blocks 9 to 12, and 13 to 16.

In the present embodiment, as described above, pixels are driven based on the image signal including a PWM control value (first luminance data) common to pixels included in one block based on a gradation average value of pixels included in one block which is a part of blocks (areas) made by dividing the display area DA, and the pixel signal (second luminance data) independent in each pixel based on a difference between the gradation value of the pixels included in the block and the gradation average value. In that case, the panel driver 5 (driver) controls the common luminance time of the pixels included in the block based on the PWM control value, and controls the current value supplied to the light emitting element 30 of each of the pixels included in the block based on the pixel signal value.

That is, in the present embodiment, the gradation of the pixels included in each block can be represented by accumulation of the luminance time controlled based on the PWM control value and the luminosity based on the current value controlled based on the pixel signal value.

FIG. 16 illustrates a relationship between the efficiency of luminance of the light emitting element 30 (micro LED) defined by candela (brightness) with respect to the current value and current density flowing to the light emitting element 30.

FIG. 16 illustrates that, as described above, the efficiency of luminance of the light emitting element 30 changes based on the current density flowing to the light emitting element 30, and in the present embodiment, the gradation of the pixels in a block is adjusted in a whole by the PWM control using the current value (current density) which maximizes the efficiency of luminance as a reference, and actual gradation of each pixel is finely tuned by the pixel signal Vsig.

With such a structure, a complicated pixel circuit can be avoided since there is no need of controlling the gradation value of all pixels by the PWM control alone, and the gradation of each pixel can be controlled with current values near the current value which maximizes the efficiency of luminance (that is, a predetermined range of the current values which can maximize the efficiency of luminance). Thus, the high luminosity and low power consumption can be achieved in the present embodiment. Note that the current values near the current value which maximizes the efficiency of luminance (values in a predetermined range of the current values which can maximize the efficiency of luminance) are current values decreased/increased from/to the current value which maximizes the efficiency of luminance in order to finely tune a difference between the gradation value of pixels included in the image signal and a gradation average value calculated with respect to the block including the pixels.

Note that the above-described structure can be achieved when each of pixels includes the PWM control transistor EM connected in series with the drive transistor DRT and the light emitting element 30 between the first main power line 41 (first power potential) and the second main power line 42 (second power potential), and the luminance time is controlled by conductivity/non-conductivity of the PWM control transistor EM.

Furthermore, in the example of FIG. 14, a plurality of pixels are driven using the PWM control value and the pixel signal value determined when the image signal to perform one frame display is acquired (that is, the PWM control value and the pixel signal value related to the image signal to perform one frame display), and the PWM control value may adopts the structure where the PWM control value determined based on the image signal to perform a frame display prior to the frame (that is, PWM control value related to the image signal of prior frame) is used.

Note that, in the present embodiment, a pixel PX includes subpixels SPR, SPG, and SPB, and the pixel PX may include a subpixel having a light emitting element which emits white light in addition to the subpixels SPR, SPG, and SPB. Furthermore, the pixel PX may include one subpixel. Note that, if the pixel PX includes one subpixel, the PWM control value may be determined based on a gradation average value of pixels PX in a block.

Furthermore, even if the pixel PX includes subpixels SPR, SPG, and SPB, the PWM control value may be determined based on a gradation average value of pixels PX, for example. In that case, the PWM control can be performed with respect to all subpixels SPR, SPG, and SPB included in pixels PX in one block with the same PWM control value.

Furthermore, FIG. 11 and the like illustrate an example where each PWM control line 45 is drawn to right and left sides of the outside of the display area DA to be arranged in the display area DA (blocks). However, the PWM control line 45 may be arranged in the blocks through the pixel PX. Furthermore, the PWM control line 45 is drawn into the blocks overlapping, for example, other signal lines and the first main power line 41 (PVDD).

Furthermore, in the present embodiment, there is a possibility that boundary unevenness may be seen in the proximity of the boundary of adjacent blocks because of a difference between PWM control values (PWM ratio) between the adjacent blocks. Such unevenness can be reduced by adding suitable correction to the pixel signal value in the panel driver 5.

Note that, in the present embodiment, a micro LED display device using micro LEDs as light emitting elements is mainly explained, and the display device 1 of the present embodiment may be an organic EL display device (organic EL display) using organic electroluminescence (EL) elements as the light emitting elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display area including a plurality of pixels arranged in a matrix; and
a driver configured to drive the pixels based on an image signal, wherein
each of the pixels includes a light emitting element and a drive transistor to control a current value to the light emitting element,
the drive transistor and the light emitting element are connected in series between a first power potential and a second power potential having a potential different from the first power potential,
the image signal to drive the pixels includes a first luminance data and a plurality of second luminance data,
the first luminance data is based on an average value of gradation values of the plurality of pixels included in one area of the display area divided into a plurality of areas,
the first luminance data is common among each of the plurality of pixels included in said one area,
each of the plurality of second luminance data is based on a difference between the gradation value of each of the plurality of pixels included in said one area and the average value, respectively, wherein
the second luminance data in one pixel included in said one area and the second luminance data in another one pixel included in said one area are independent of each other, and
the driver controls a common luminance time of the pixels included in said one area based on the first luminance data, and controls a current value to be supplied to the luminance element of each of the pixels included in said one area based on the second luminance data.

2. The device of claim 1, wherein
the gradation of the pixels included in said one area is determined by accumulating a light emitting time controlled based on the first luminance data and a light emitting luminance based on a current value controlled based on the plurality of second luminance data.

3. The device of claim 1, wherein
the light emitting element is a micro LED mounted on a pixel electrode formed to corresponding to the pixel in the display area.

4. The device of claim 3, wherein
the current value controlled based on one of the plurality of second luminance data is a value within a range predetermined from a current value which maximizes efficiency of light emittance of the micro LED.

5. The device of claim 1, wherein
each of the plurality of pixels includes a control transistor connected in series with the drive transistor and the light emitting element between the first power potential and the second power potential, and
the light emitting time is controlled by conductivity/non-conductivity of the control transistor.

6. The device of claim 1, wherein
the first luminance data and the plurality of second luminance data are included in the image signal to perform one frame display.

7. The device of claim 1, wherein
the plurality of second luminance data is included in the image signal to perform one frame display, and
the first luminance data is included in the image signal to perform a frame display which is prior to the one frame display.

8. A driving method for a display device,
the display device including a display area on which a plurality of pixels are arranged in a matrix, each of the pixels including a light emitting element and a drive transistor to control a current value to the light emitting element, and
the drive transistor and the light emitting element being connected in series between a first power potential and a second power potential having a potential different from the first power potential,
the method comprising:
acquiring an image signal; and
driving the pixels based on the acquired image signal, wherein
the image signal to drive the pixels includes a first luminance data and a plurality of second luminance data,
the first luminance data is based on an average gradation value of gradation values of the plurality of pixels included in one area of the display area divided into a plurality of areas,
the first luminance data is common among each of the plurality of pixels included in said one area,
each of the plurality of second luminance data is based on a difference between the gradation value of each of the plurality of pixels included in said one area and the average value, respectively, wherein
the second luminance data in one pixel included in said one area and the second luminance data in another one pixel included in said one area are independent of each other, and
the driving includes:
controlling a common luminance time of the pixels included in said one area based on the first luminance data; and controlling a current value to be supplied to the luminance element of each of the pixels included in said one area based on the second luminance data.

9. The method of claim 8, wherein
the gradation of the pixels included in said one area is determined by accumulating a light emitting time controlled based on the first luminance data and a light emitting luminance based on a current value controlled based on the plurality of second luminance data.

10. The method of claim 8, wherein
the light emitting element is a micro LED mounted on a pixel electrode formed to corresponding to the pixel in the display area.

11. The method of claim 10, wherein
the current value controlled based on one of the plurality of second luminance data is a value within a range predetermined from a current value which maximizes efficiency of light emittance of the micro LED.

12. The method of claim 8, wherein
each of the plurality of pixels includes a control transistor connected in series with the drive transistor and the light emitting element between the first power potential and the second power potential, and
the light emitting time is controlled by conductivity/non-conductivity of the control transistor.

13. The method of claim 8, wherein
the first luminance data and the plurality of second luminance data are included in the image signal to perform one frame display.

14. The method of claim 8, wherein
the plurality of second luminance data is included in the image signal to perform one frame display, and
the first luminance data is included in the image signal to perform a frame display which is prior to the one frame display.

* * * * *